US010957413B2

(12) United States Patent
Takahashi et al.

(10) Patent No.: US 10,957,413 B2
(45) Date of Patent: Mar. 23, 2021

(54) SHARED ERROR CHECK AND CORRECT LOGIC FOR MULTIPLE DATA BANKS

(71) Applicant: Micron Technology, Inc., Boise, ID (US)

(72) Inventors: Susumu Takahashi, Kanagawa (JP); Hiroki Fujisawa, Kanagawa (JP)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 16/176,952

(22) Filed: Oct. 31, 2018

(65) Prior Publication Data

US 2020/0135291 A1  Apr. 30, 2020

(51) Int. Cl.
| | | |
|---|---|---|
| G11C 29/00 | (2006.01) | |
| G11C 29/42 | (2006.01) | |
| G11B 20/18 | (2006.01) | |
| G11C 8/10 | (2006.01) | |
| G11C 7/10 | (2006.01) | |
| G11C 8/12 | (2006.01) | |

(52) U.S. Cl.
CPC .......... *G11C 29/42* (2013.01); *G11B 20/1833* (2013.01); *G11C 7/1009* (2013.01); *G11C 8/10* (2013.01); *G11C 8/12* (2013.01); *G11C 2216/22* (2013.01)

(58) Field of Classification Search
CPC .. G11C 29/42; G11C 8/12; G11C 8/10; G11C 7/1009; G11C 2216/22; G11C 29/52; G11C 2029/0411; G11B 20/1833
USPC ....................................................... 714/764
See application file for complete search history.

(56) References Cited

U.S. PATENT DOCUMENTS

| | | | | |
|---|---|---|---|---|
| 6,061,281 A | * | 5/2000 | Nagata ................. | G11C 29/808 365/200 |
| 10,388,362 B1 | * | 8/2019 | Hadrick .............. | G11C 11/4093 |
| 2001/0030896 A1 | * | 10/2001 | Ooishi ................. | G11C 29/848 365/200 |
| 2004/0184327 A1 | * | 9/2004 | Okuda ................... | G11C 29/42 365/199 |
| 2005/0185483 A1 | * | 8/2005 | Sugiura ................ | G11C 29/808 365/200 |
| 2006/0129740 A1 | * | 6/2006 | Ruckerbauer ....... | G06F 13/1631 711/5 |
| 2007/0177441 A1 | * | 8/2007 | Lee ....................... | G11C 29/787 365/200 |
| 2008/0091979 A1 | * | 4/2008 | Okuda ................... | G11C 29/42 714/42 |
| 2009/0185438 A1 | * | 7/2009 | Kim ..................... | G11C 29/785 365/200 |

(Continued)

OTHER PUBLICATIONS

International Search Report and Written Opinion for PCT Application No. PCT/US2019/038291 dated Oct. 4, 2019; 11 Pages.

(Continued)

*Primary Examiner* — Albert Decady
*Assistant Examiner* — Enamul M Kabir
(74) *Attorney, Agent, or Firm* — Fletcher Yoder, P.C.

(57) ABSTRACT

Systems and methods related to memory devices that may perform error check and correct (ECC) functionality. The systems and methods may employ ECC logic that may be shared between two or more banks. The ECC logic may be used to perform memory operations such as read, write, and masked-write operations, and may increase reliability of storage data.

22 Claims, 19 Drawing Sheets

(56) References Cited

U.S. PATENT DOCUMENTS

| | | | |
|---|---|---|---|
| 2011/0085393 A1* | 4/2011 | Kwack | G11C 7/1048 |
| | | | 365/193 |
| 2012/0054562 A1* | 3/2012 | Park | G11C 5/025 |
| | | | 714/710 |
| 2014/0181574 A1* | 6/2014 | Resnick | G06F 11/1004 |
| | | | 714/6.2 |
| 2014/0317471 A1 | 10/2014 | Ryu et al. | |
| 2016/0048425 A1* | 2/2016 | Kim | G11C 29/52 |
| | | | 714/764 |
| 2016/0092305 A1* | 3/2016 | Alam | G06F 11/1076 |
| | | | 714/764 |
| 2016/0110253 A1 | 4/2016 | Sun-Gyeum et al. | |
| 2016/0231962 A1* | 8/2016 | Ware | G06F 3/0659 |
| 2017/0091021 A1* | 3/2017 | Abedifard | G06F 11/1044 |
| 2018/0068700 A1* | 3/2018 | Wang | G11C 7/065 |
| 2018/0129427 A1* | 5/2018 | Kim | G11C 16/26 |
| 2018/0174657 A1* | 6/2018 | Rana | G11C 16/32 |
| 2018/0322008 A1* | 11/2018 | Chung | G06F 3/0619 |
| 2019/0258540 A1* | 8/2019 | Sharon | G06F 11/1068 |

OTHER PUBLICATIONS

JEDEC Standard, "Low Power Double Date Rate 4 (LPDDR4)," JEDEC Solid State Technology Association, pp. 1-307, Arlington, VA, 22201-2107, Feb. 2017.

\* cited by examiner

SHARED ERROR CHECK AND CORRECT LOGIC FOR MULTIPLE DATA BANKS

BACKGROUND

1. Field of the Present Disclosure

This disclosure relates to memory systems and devices and, more specifically, to error check and correct (ECC) circuitry.

2. Description of Related Art

This section is intended to introduce the reader to various aspects of art that may be related to various aspects of the present disclosure, which are describe and/or claimed below. This discussion is believed to be helpful in providing the reader with background information to facilitate the understanding of the various aspects of the present disclosure. Accordingly, it should be understood that these statements are to be read in this light, and not as admissions of prior art.

Memory devices, such as random access memory (RAM) devices, dynamic RAM devices (DRAMs), static RAM devices (SRAMs), or flash memories, are an important component in electronic systems and devices, such as computers, servers, networking devices, mobile phones, smartphones, wearable devices, media players, internet of thing (IoT) devices, and the like. The memory devices may be used to provide memory functionality for processing circuitry (e.g., a processor, a microcontroller, a system-on-chip), and facilitate data processing operations and/or provide data storage during data processing operations. To that end, the memory devices may have addressable memory elements arranged in memory arrays and/or banks. These memory devices may also include a control interface, which allows the memory device to receive commands and addresses, and/or an input/output (I/O) interface that provides data access between memory elements and the processing circuitry.

Certain memory devices may provide error check and correct (ECC) functionality, which may be used to improve the reliability of the data storage. In such systems, the data stored in the memory elements, arrays, or banks, may be associated with (e.g., stored with) error bits or parity bits. The parity bits may provide data redundancy that allows verification of data integrity. For example, during a write operation, ECC circuitry may be used to determine parity bits, which may be stored with the write data. During a read operation, the ECC circuitry may retrieve read data along with parity bits and check for errors in the read data. During a masked-write operation, the ECC circuitry may retrieve old data, correct errors using the parity bits, perform the masked-write operation, and generate the new parity bits with the new masked word. Generally, the ECC code may allow verification and/or correction of data, and the ECC circuitry may perform the error correction accordingly.

The ECC circuitry may be associated with data banks or data bank sections. An example of a memory device with ECC circuitry is the dynamic random access memory (DRAM) array 10, illustrated in FIGS. 1A, 1B, and 1C. The DRAM array 10 may have eight data banks and each data bank may have four memory blocks. In the example, DRAM array 10 has data bank 0 with memory blocks 12A, 12B, 12C, and 12D, data bank 1 with memory blocks 14A, 14B, 14C, and 14D, data bank 2 with memory block 16A, 16B, 16C, and 16D, data bank 3 with memory blocks 18A, 18B, 18C, and 18D, data bank 4 with memory blocks 22A, 22B, 22C, and 22D, data bank 5 with memory blocks 24A, 24B, 24C, and 24D, data bank 6 with memory blocks 26A, 26B, 26C, and 26D, and data bank 7 with memory blocks 28A, 28B, 28C, and 28D.

The blocks may be controlled by bank logic circuitry. In the example of DRAM array 10, data bank 0 is associated with bank logics 32A and 32B, data bank 1 is associated with bank logics 34A and 34B, data bank 2 is associated with bank logics 36A and 36B, data bank 3 is associated with bank logics 38A and 38B, data bank 4 is associated with bank logics 42A and 42B, data bank 5 is associated with bank logics 44A and 44B, data bank 6 is associated with bank logics 46A and 46B, and data bank 7 is associated with bank logics 48A and 48B. The illustrated DRAM array 10 may also include a peripheral circuitry block 50. Each memory block may be associated with a dedicated column decoder 52 and row decoder 54, as illustrated.

As discussed above, memory devices conventionally have dedicated ECC circuitry for each data bank. This may provide each data bank with dedicated ECC functionality. In the illustrated DRAM array 10, each data bank is illustrated as being served by two dedicated ECC blocks. For example, ECC blocks 62A and 62B may be dedicated to data bank 0. As illustrated, ECC block 62A serves memory blocks 12A and 12B, and ECC block 62B serves memory blocks 12C and 12D. Similarly, ECC block 64A serves memory blocks 14A and 14B, and ECC block 64B serves memory blocks 14C and 14D of data bank 1, ECC block 66A serves memory blocks 16A and 16B, and ECC block 66B serves memory blocks 16C and 16D of data bank 2, ECC block 68A serves memory blocks 18A and 18B, and ECC block 68B serves memory blocks 18C and 18D of data bank 3, ECC block 72A serves memory blocks 22A and 22B, and ECC block 72B serves memory blocks 22C and 22D of data bank 4, ECC block 74A serves memory blocks 24A and 24B, and ECC block 74B serves memory blocks 24C and 24D of data bank 5, ECC block 76A serves memory blocks 26A and 26B, and ECC block 76B serves memory blocks 26C and 26D of data bank 6, ECC block 78A serves memory blocks 28A and 28B, and ECC block 78B serves memory blocks 28C and 28D of data bank 7. The DRAM array 10 may have, as dimensions, a length 82 and a height 84.

Arrangements such as the one described above, in which each data bank may have dedicated ECC circuitry, facilitate the design of memory devices compliant with certain user specifications and/or standard specifications. For example, certain standards (e.g., Joint Electron Device Engineering Council (JEDEC) standards) may have different latency specifications between two commands (i.e., the minimum period between two consecutive commands) when the two commands are issued to an address in the same data bank or in different data banks. That is, a command issued to two addresses in two different data banks may have a smaller latency specification, whereas a command issued to two addresses of a common bank may have a larger latency specification. As an example, in the JEDEC specification for masked-write (MWR) commands in low power double data rate 4 (LPDDR4) memory, a minimum latency between two adjacent masked read commands is 4*tCCD when they are issued to the same data bank and 1*tCCD when issued to different data banks. In other words, the interval of adjacent MWR commands for the same data bank may be relatively long, whereas the interval of the two adjacent MWR commands for different data banks may be considerably short. As ECC operations may be performed during a masked-write operation, the presence of ECC circuitry dedicated to each data bank may facilitate satisfaction of the short interval for MWR commands in different data blocks.

The presence of dedicated ECC circuitry per data bank may occupy substantial floorplan resources. As memory devices become more dense (e.g., more memory per device) and/or the dimensions of the memory devices decrease, available floorplan for memory logic, including ECC logic, may become more limited.

BRIEF DESCRIPTION OF THE DRAWINGS

Various aspects of this disclosure may be better understood upon reading the following detailed description and upon reference to the drawings in which.

DETAILED DESCRIPTION

Figure 1A:
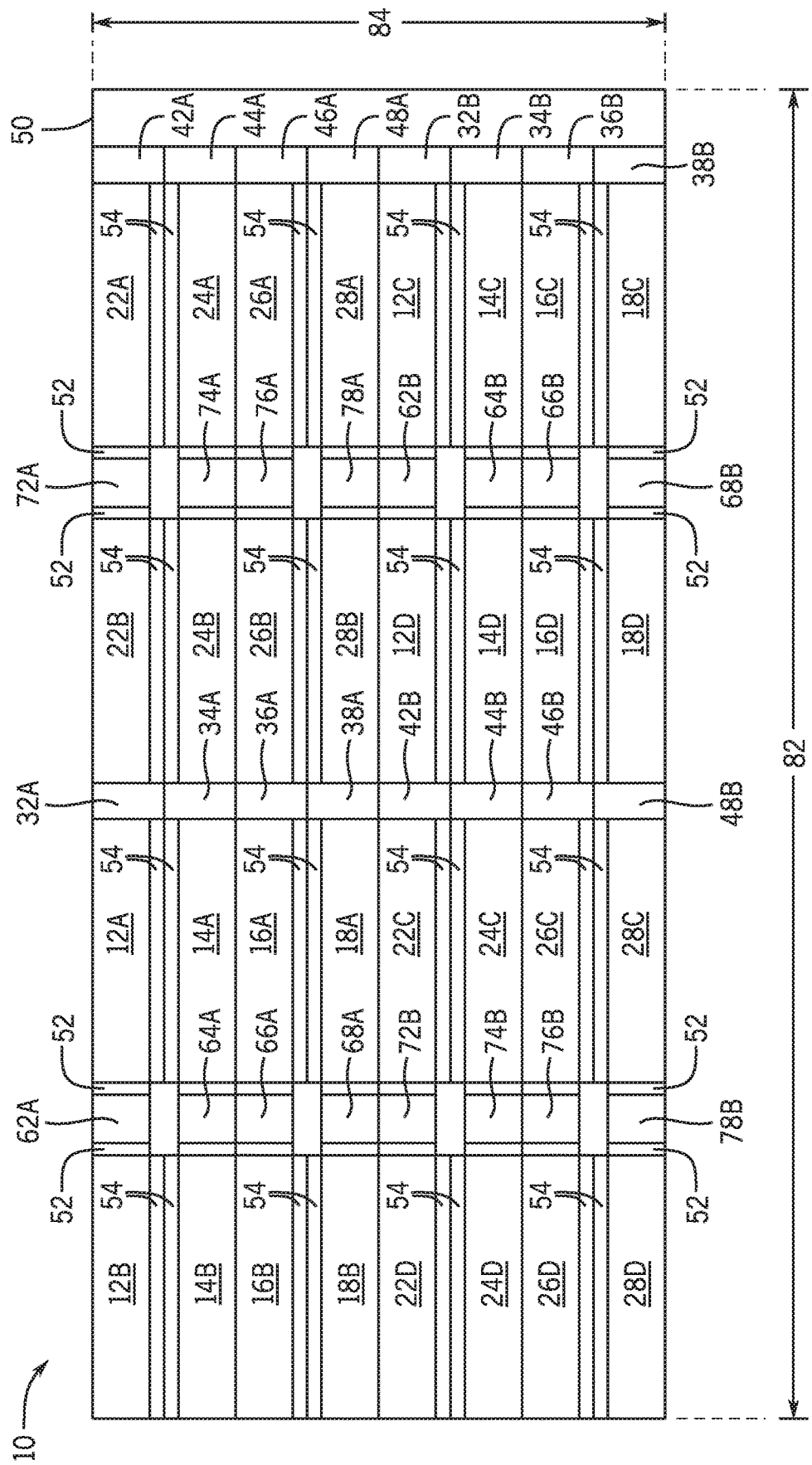
FIGS. 1A, 1B, and 1C illustrate a conventional dynamic random access memory (DRAM) array having dedicated error-check and correct (ECC) blocks.

One or more specific embodiments will be described below. In an effort to provide a concise description of these embodiments, not all features of an actual implementation are described in the specification. It may be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it may be appreciated that such a development effort might be complex and time consuming, but would nevertheless be a routine undertaking of design, fabrication, and manufacture for those of ordinary skill having the benefit of this disclosure.

Many electronic systems and devices, such as computers, mobile phones, wearable devices, internet of thing (IoT) devices, servers, data center processing and storage devices, and the like, may employ memory devices to provide data storage functionalities and/or facilitate the performance of data processing operations. To that end, these electronic systems may include processing circuitry that may be coupled to the memory devices. Several memory devices may store data using addressable memory elements (e.g., memory rows or columns), which may be disposed in data banks. Examples of addressable memory devices include random access memory (RAM) devices, dynamic RAM (DRAM) devices such as synchronous DRAM (SDRAM) devices, double data rate SDRAM devices (e.g., DDR SDRAM, DDR2 SDRAM, DDR3 SDRAM, DDR4 SDRAM), low power DDR devices (e.g., LPDDR3 SDRAM, LPDDR4 SDRAM), and graphics DDR SDRAM devices (e.g., GDDR3 SDRAM, GDDR4 SDRAM), as well as static RAM (SRAM) devices, and/or flash memory devices, among others.

To interact with the memory device, processing circuitry in the electronic systems may access (e.g., read or write) the memory elements by interacting with an input/output (I/O) interface and a command interface. As an example, a processor may store information by providing a write command and/or an address for a memory element along with a series of words to be stored, and read stored information from a particular memory element from the memory device by providing a read command and/or an address and receiving stored words. The commands and/or addresses may be provided via the command interface, and the requested information (e.g., words) may be retrieved via the I/O interface. Certain memory devices may be capable of performing masked-write operations. In a masked operation, the processor may provide a masked-write command and/or an address for a memory element containing old data, along with a series of words to be stored and a data mask that indicates which portions of the old data should be preserved.

Many devices also include error check and correct (ECC) circuitry, which may be used to improve data integrity. The ECC circuitry may be used to generate parity bits (e.g., error checking bits, ECC bits, error bits) that can be stored along with the data during a write operation. The ECC circuitry may also check and/or correct the stored data using previously stored error bits during a read operation. In some embodiments, the ECC circuitry may mark (e.g., tag) words identified as corrupted or unrepairable. In masked-write operations, the ECC logic may retrieve the old data, identify any errors to generate a corrected old data, apply the modifications based on the incoming data and the data mask to produce the new data, generate new parity bits, and store the new data with the new parity bits. In that manner, the ECC circuitry may provide redundancy to the stored data, which may increase reliability of storage operations.

As discussed above, ECC operations may be performed for every operation that may access, store, or modify data in the data banks, including read, write, and/or masked-write operations. As such, in order to comply with certain latency specifications (e.g., read, write, and masked-write specifications), adequate allocation of ECC resources (e.g., number and distribution of ECC circuitry) may impact the design of the memory device. For example, as discussed above, the latency periods between commands issued to the same data bank (i.e., to addresses associated with a common data bank) may be relatively long, whereas the latency periods between commands to distinct data banks (i.e., to addresses in different data banks) may be considerably short. Therefore, the allocation of ECC performance resources may be made based on the arrangement of the data banks.

Figure 1B:
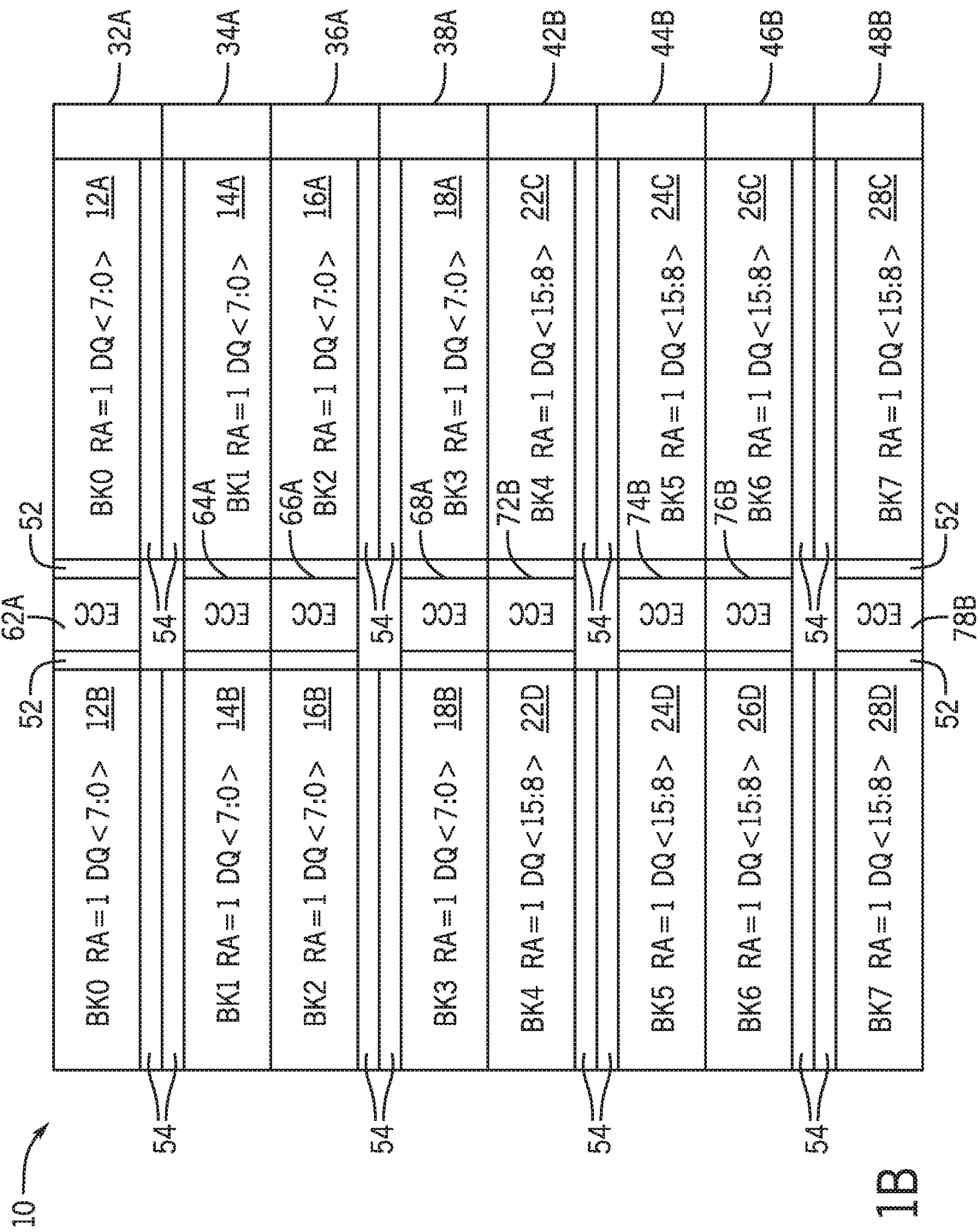
Figure 1C:
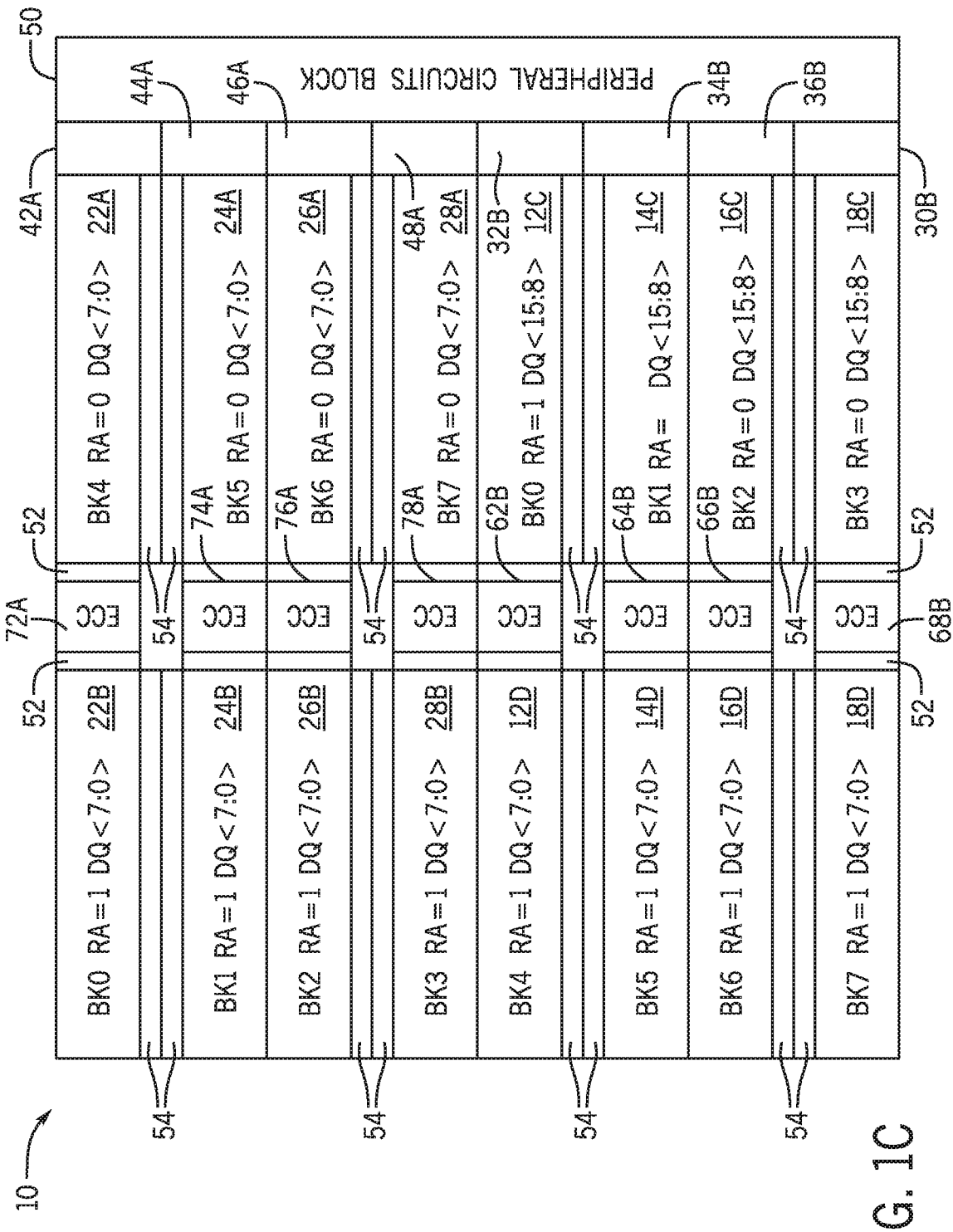

In conventional systems, such as the DRAM array 10 illustrated in FIGS. 1A-C, each data bank may have one or more dedicated ECC blocks to serve its memory blocks, as described above. Embodiments of this specification include memory devices that may have ECC blocks that may be shared by memory blocks of different data banks. Such sharing may allow reduction in the number and/or size of ECC blocks employed, which may result in a reduced floorplan die, faster operation of the memory device, and/or increased memory density. As the ECC blocks may be shared by data banks of different ECC blocks, the ECC blocks may include input circuitry, output circuitry, block selection circuitry, latching circuitry, and/or multiplexing circuitry that may facilitate access by different data banks. Such implementations may facilitate compliance with standards having relatively short latency periods for commands issued to different data banks that may share an ECC block. The improvements described herein may also reduce the latency of commands issued to a common memory block, and may increase the speed of operations by the memory device.

Figure 2A:
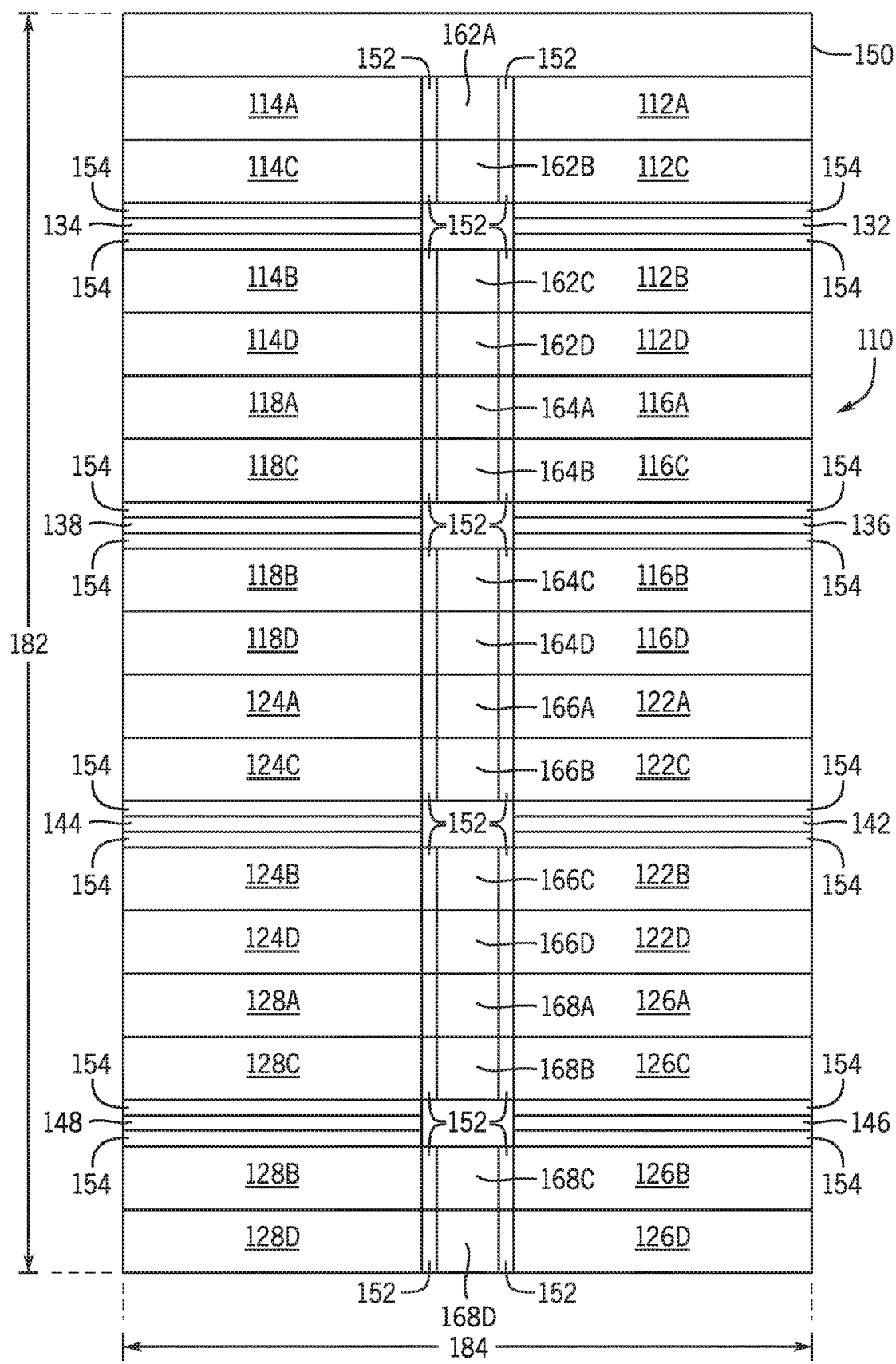
FIGS. 2A, 2B, and 2C illustrate a DRAM array having shared ECC blocks, in accordance with embodiments of the present disclosure.
Figure 2B:
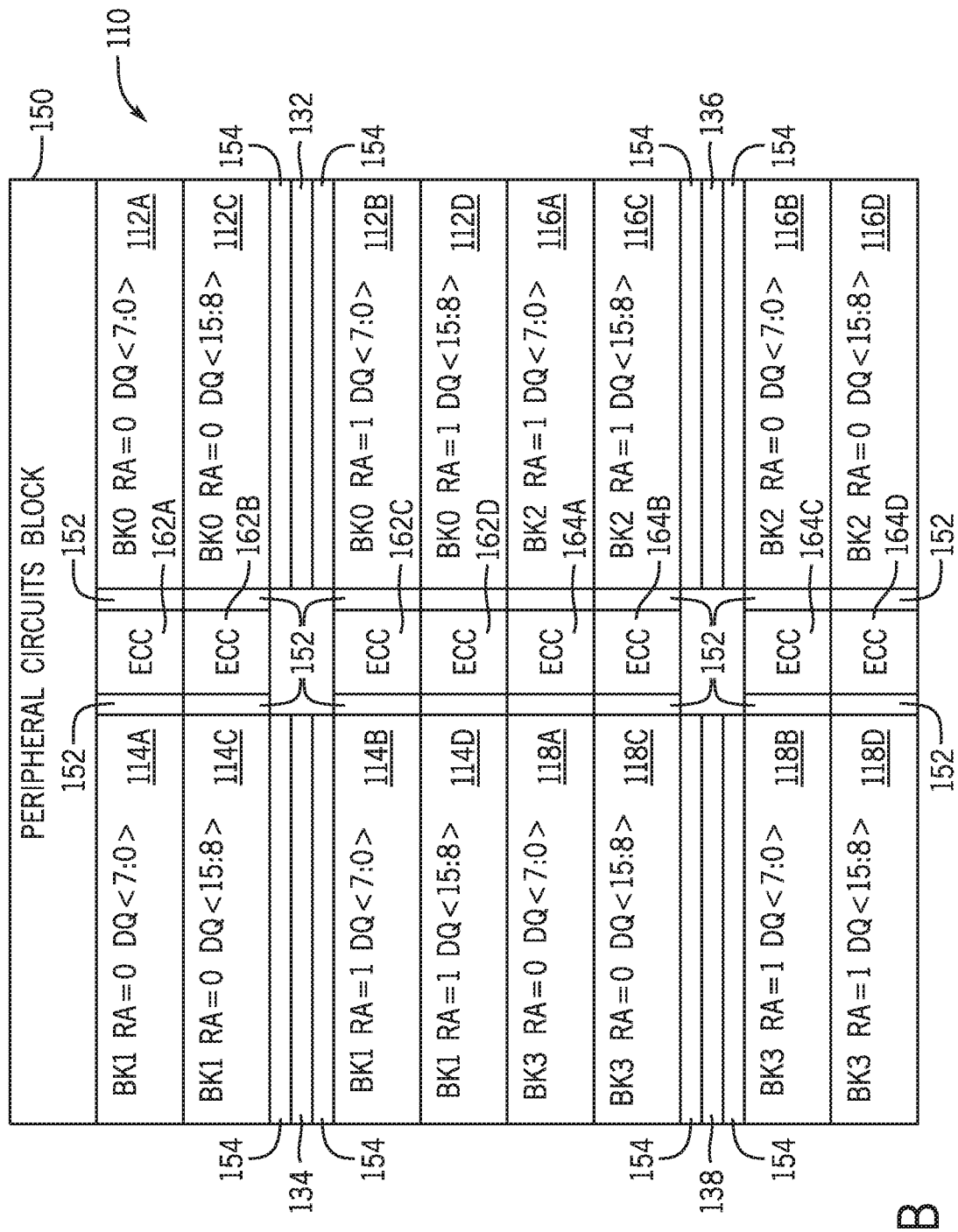
Figure 2C:
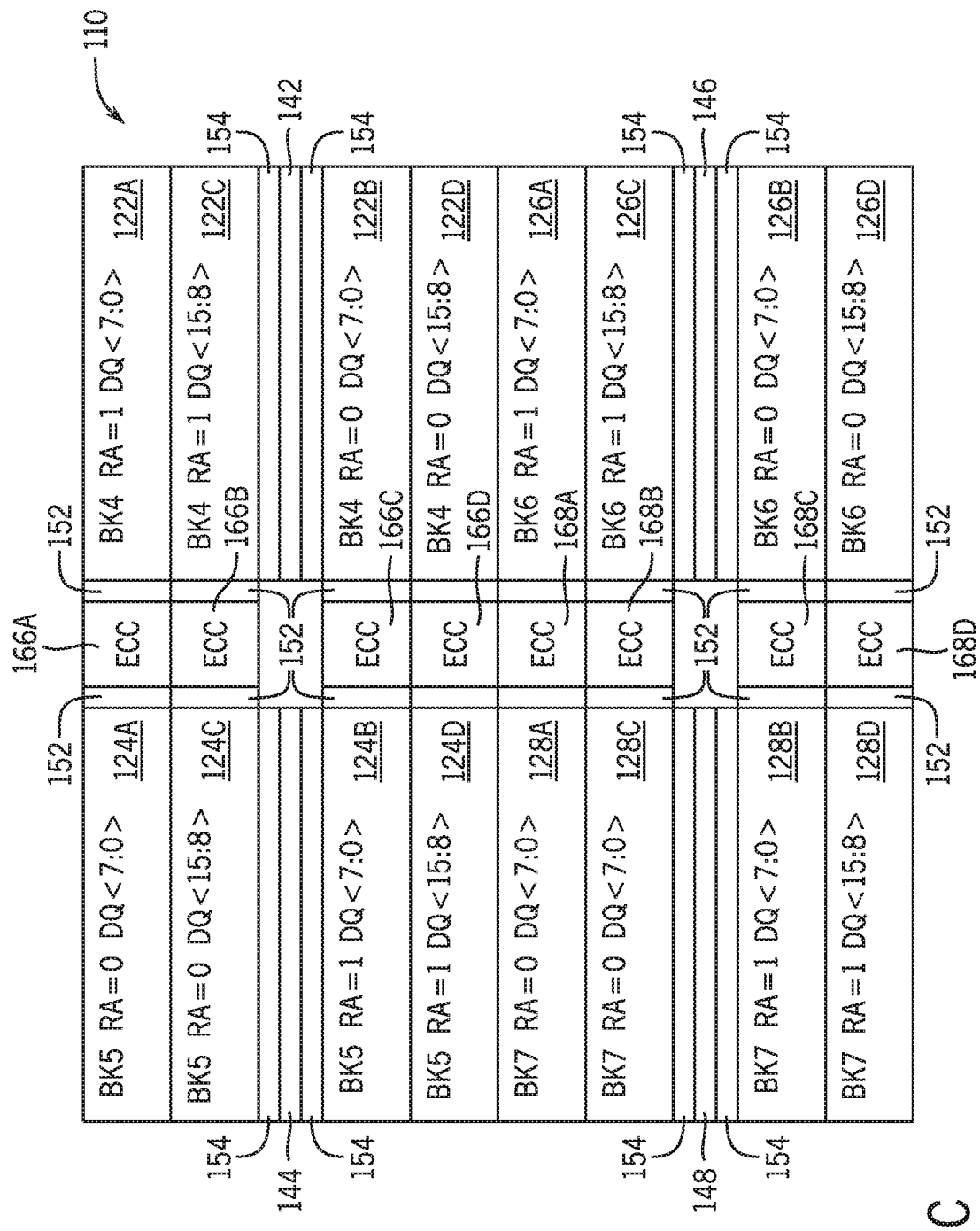

With the foregoing in mind, FIGS. 2A, 2B, and 2C provide an illustration of a DRAM array 110 that may employ ECC blocks that serve different data banks. The DRAM array 110 may have eight data banks with each data bank having four memory blocks. In the example, DRAM array 110 has data bank 0 with memory blocks 112A, 112B, 112C, and 112D, data bank 1 with memory blocks 114A, 114B, 114C, and 114D, data bank 2 with memory block 116A, 116B, 116C, and 116D, data bank 3 with memory blocks 118A, 118B, 118C, and 118D, data bank 4 with memory blocks 122A, 122B, 122C, and 122D, data bank 5 with memory blocks 124A, 124B, 124C, and 124D, data bank 6 with memory blocks 126A, 126B, 126C, and 126D, and data bank 7 with memory blocks 128A, 128B, 128C, and 128D. As such, the capacity (i.e., the memory capacity) of DRAM array 110 may be similar to that of DRAM array 10 illustrated in FIGS. 1A, 1B, and 1C.

The memory blocks may be controlled by bank logic circuitry. In DRAM array 110, the memory blocks of each data bank may be adjacent. As a result, the number of bank logic blocks may be reduced, with a single bank logic block for each data bank. As illustrated in the DRAM array 110, data bank 0 may be associated with a single bank logic 132, data bank 1 is associated with bank logic 134, data bank 2 is associated with bank logic 136, data bank 3 is associated with bank logic 138, data bank 4 is associated with bank logic 142, data bank 5 is associated with bank logic 144, data bank 6 is associated with bank logic 146, and data bank 7 is associated with bank logic 148. As a result, the number of bank logic blocks may be reduced from 32 in DRAM array 10 to 16 in DRAM array 110 without any reduction in the memory capacity.

The illustrated DRAM array 110 may include a peripheral circuitry block 150. The memory blocks may also be associated with column decoder blocks 152 and row decoder blocks 154, as illustrated in the example. As discussed above, in DRAM array 110, the memory blocks of each data bank may be adjacent. As a result, it should be noted that the number of row decoder blocks 154 may be reduced from 32 in the DRAM array 10 to 16 in the DRAM array 110. This may be a result of sharing the row decoder blocks 154. For example, in data bank 0, memory blocks 112A and 112C may share a first row decoder 154 and memory blocks 112B and 112D may share a second row decoder 154, as illustrated. Memory blocks 112A and 112C may share a row decoder 154 as they are activated by common addresses that share up to the most significant bit (i.e., RA=0), and memory blocks 112B and 112D may share a row decoder 154 as they are activated by common addresses up to the most significant bit (i.e., RA=1). As illustrated, data banks 1, 2, 3, 4, 5, 6, and 7 may also have similar arrangements for row decoder blocks 154, with two memory blocks activated by a common row address served by each row decoder block 154.

The arrangement of the DRAM array 110 may also include the presence of shared ECC logic blocks. For example, ECC blocks 162A, 162B, 162C, and 162D may be shared by memory blocks of data bank 0 and 1. Shared ECC block 162A may serve memory blocks 112A of data bank 0 and 114A of data bank 1, shared ECC block 162B may serve memory blocks 112C of data bank 0 and 114C of data bank 1, shared ECC block 162C may serve memory blocks 112B of data bank 0 and 114B of data bank 1, and shared ECC block 162D may serve memory blocks 112D of data bank 0 and 114D of data bank 1.

Similarly, ECC blocks 164A, 164B, 164C, and 164D may be shared by memory blocks of data banks 2 and 3. Shared ECC block 164A may serve memory blocks 116A of data bank 2 and 118A of data bank 3, shared ECC block 164B may serve memory blocks 116C of data bank 2 and 118C of data bank 3, shared ECC block 164C may serve memory blocks 116B of data bank 2 and 118B of data bank 3, and shared ECC block 164D may serve Memory blocks 116D of data bank 2 and 118D of data bank 3.

The shared arrangement for ECC blocks is also found between data banks 4 and 5. The ECC blocks 166A, 166B, 166C, and 166D may be shared by memory blocks of data bank 4 and 5. Shared ECC block 166A may serve memory blocks 122A of data bank 4 and 124A of data bank 5, shared ECC block 166B may serve memory blocks 122C of data bank 4 and 124C of data bank 5, shared ECC block 166C may serve memory blocks 122B of data bank 4 and 124B of data bank 5, and shared ECC block 166D may serve memory blocks 122D of data bank 4 and 124D of data bank 5. A similar arrangement is also illustrated in ECC blocks 168A, 168B, 168C, and 168D, shared by memory blocks of data bank 6 and 7. Shared ECC block 168A may serve memory blocks 126A of data bank 6 and 128A of data bank 7, shared ECC block 168B may serve memory blocks 126C of data bank 6 and 128C of data bank 7, shared ECC block 168C may serve memory blocks 126B of data bank 6 and 128B of data bank 7, and shared ECC block 168D may serve memory blocks 126D of data bank 6 and 128D of data bank 7. As a result of the arrangement, the DRAM array 110 may have a length 182 and a height 184 that may be smaller than length 82 and height 84 for the DRAM array 10, resulting in more compact device with the same capacity. That is, if the DRAM array 110 has the same length and height as the DRAM 10, the memory capacity of DRAM array 110 becomes greater than the DRAM array 10.

Figure 3:
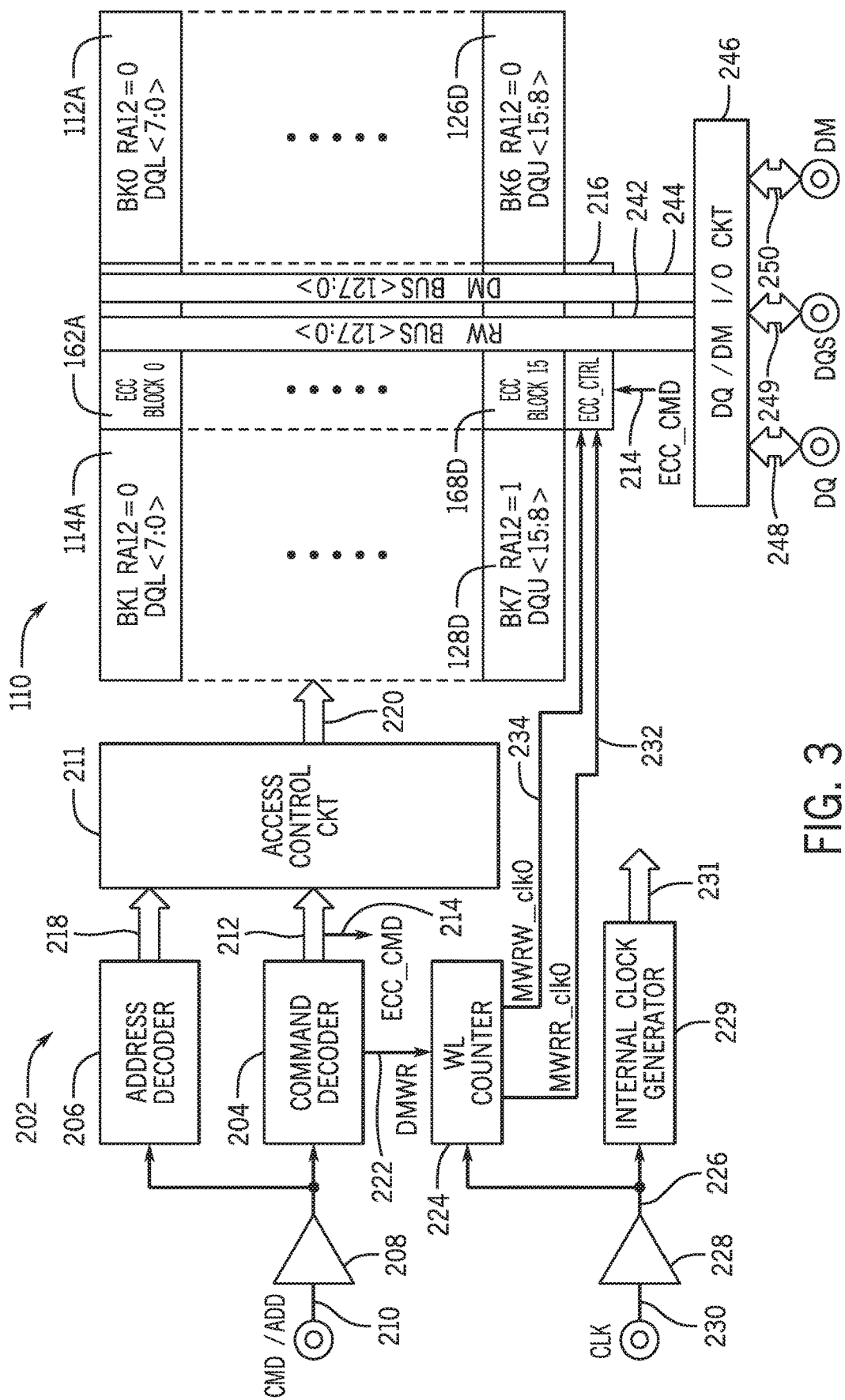
FIG. 3 is a schematic block diagram of a memory device that may employ shared ECC blocks, in accordance with embodiments of the present disclosure.

With the foregoing in mind, FIG. 3 illustrates a block diagram of a memory device 202. The memory device 202 may include control circuitry that may be configured to control and access the DRAM array 110. The control circuitry of memory device 202 may include command decoder 204 and address decoder 206. The command decoder 204 and the address decoder 206 may receive from an input buffer 208 a command and address signal 210 that may be provided by processing circuitry coupled to the memory device 202. Command decoder 204 may generate a set of instructions to an access control circuitry 211 using command signals 212. Command signals 212 may include an ECC command (ECC_CMD) signal 214 that may be used to control an ECC control logic (ECC_CTRL) 216. The ECC control logic 216 may control ECC blocks 162A, 162B, 162C, 162D, 164A, 164B, 164C, 164D, 166A, 166B, 166C, 166D, 168A, 168B, 168C, and 168D (only ECC blocks 162A and 168D are illustrated in FIG. 3). The ECC command signal 214 may indicate the command decoded by the command decoder 204 from the command and address signal 210. As such, the ECC command signal 214 may contain information that describes the requested memory device operation, such as a masked-write command, a read command, a write command, or any other operation that may employ ECC functionality. The address decoder 206 may generate an address signal 218 that may be used by an access control circuitry 211. The access control circuitry 211 may use the command signals 212 and the address signals 218 to generate the appropriate activation signals 220 that may be used to activate the data banks and/or memory blocks in the DRAM array 110.

The control circuitry of the memory device 202 may also include clocking circuitry. To that end, a clock signal 226 may be provided by an input buffer 228 that may receive a clock signal 230 from an external processing circuit accessing the memory. The clock signal 226 may be provided to an internal clock generator 229 that generates a series of internal clocks signals 231. The control circuitry of the memory device 202 may also include circuitry that may be used to generate synchronization signals from the clock signal 226 to assist the operations of the ECC control logic 216. For example, a write latency counter 224 that receives the clock signal 226 may be used to generate initiation signal (MWRR_clk0) 232 and initiation signal (MWRW_clk0) 234. The initiation signals 232 and 234 may be used to coordinate operations of the ECC blocks, as detailed below. The initiation signals 232 and 234 may be generated in response to signals generated by the command decoder 204. For example, if the command decoder 204 identifies that the command and address signal 210 is related with a masked-write command, a masked-write signal (DMWR) 222 may be generated to trigger the generation of the initiation signals 232 and 234.

The DRAM array 110 may be coupled to a read/write (RW) bus 242 and a data mask (DM) bus 244. The RW bus 242 may be used to carry words to and from the memory blocks of the DRAM array 110. The DM bus 244 may be used to carry data masks that may be associated with masked-write operations, as detailed below. Both the RW bus 242 and the DM bus 244 may be coupled to the ECC blocks 162A-D, 164A-D, 166A-D, 168A-D, and the ECC control logic 216. In some embodiments, the RW bus 242 may be 128 bits wide and the DM bus 244 may be 16 bits wide, as illustrated. The RW bus 242 and the DM bus 244 may be coupled to input/output (I/O) circuitry 246 in the memory device.

The I/O circuitry 246 may exchange data with the processing circuitry using data (DQ) signals 248 and data strobe signals (DQS) signals 249. In this example, the I/O circuit 246 may receive the DQ signals 248 via 16 pins, that may support 8 bits of a lower byte (e.g., DQ<7:0>) and 8 bits of an upper byte (e.g., DQ<8:15). The I/O circuitry 246 may also receive data mask signals 250 to perform masked-write operations. DQ signals 248 may be provided at the double data rate of the DQS signals 249. The I/O circuit 246 may receive the data masks signals 250 via two pins, which may correspond to lower and upper bytes of the data. The burst length (i.e., the number of bits sequentially provided by the processor to each pin) of the memory device 202 may be 16 or 32. During masked-write operations, the burst length may be 16. As a result, during a masked-write operation the I/O circuit 246 may receive 256 bits through DQ signals 248 (i.e., a sequence of 16 bits in each of the 16 pins), and provide the 256 bits to the RW bus 242 in two cycles. Moreover, the I/O circuitry 246 may receive 32 bits through DM signals 250 (i.e., a sequence of 16 bits in each of the two pins), and provide 16 bits to the DM bus 244 in two cycles. Accordingly, during masked-write operations, data provided via the RW bus 242, and data mask provided via the DM bus 244 are provided in parallel in two cycles.

Figure 4A:
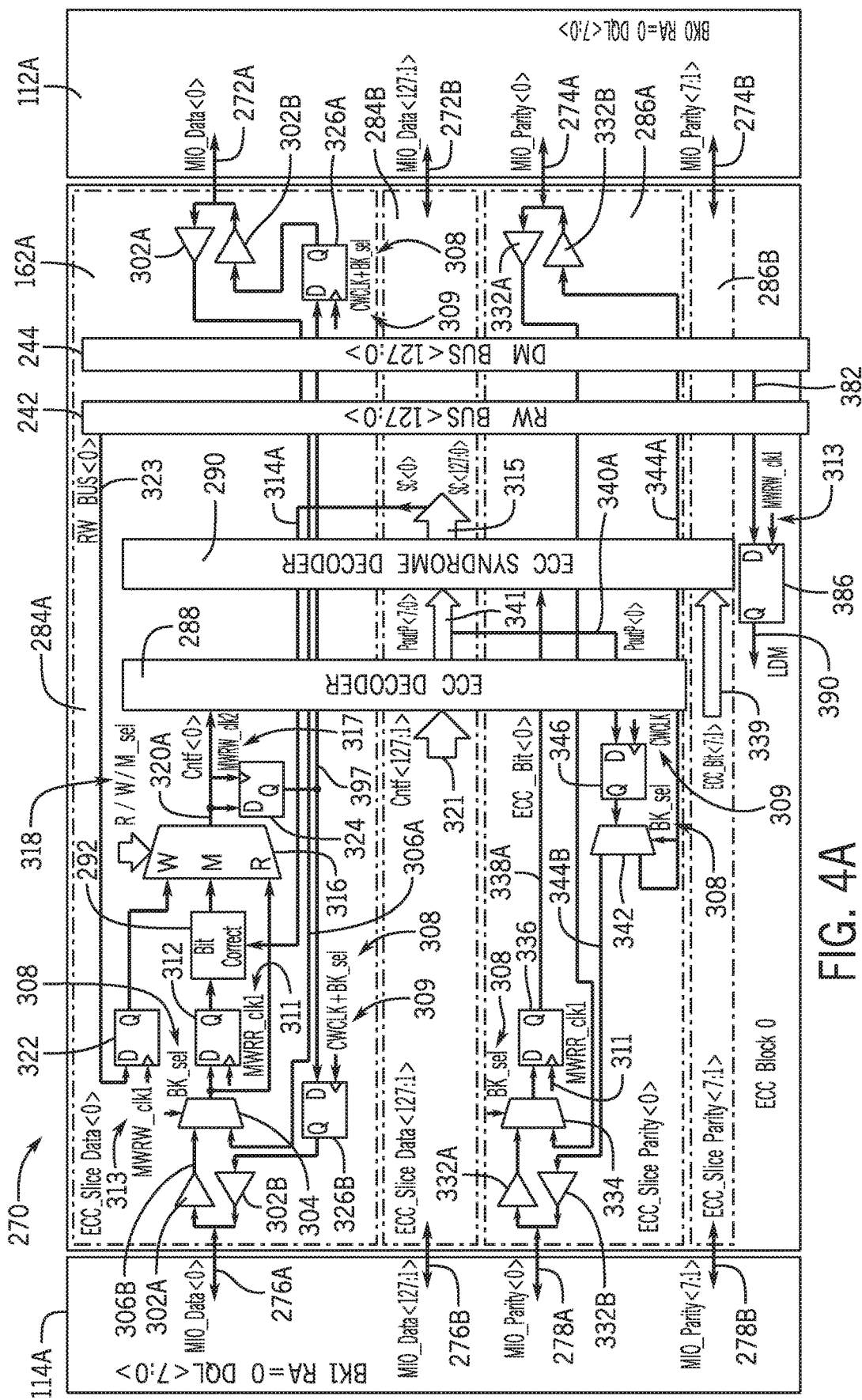
FIG. 4A is a schematic block diagram of a shared ECC block coupled to different data banks, in accordance with embodiments of the present disclosure.

FIG. 4A illustrates a schematic block diagram 270 of a portion of the DRAM array 110 that includes the shared ECC block 162A coupled to memory blocks 112A of data bank 0 and 114A of data bank 1. The block diagram illustrates portions of the ECC block 162A that may facilitate the shared operation of the ECC block and may decrease the minimum latency between consecutive commands of the memory device 202. It should be noted that the shared ECC blocks 162B, 162C, 162D, 164A, 164B, 164C, 164D, 166A, 166B, 166C, and 166D may be arranged in a similar manner as described above.

As discussed above, the shared ECC block 162A may be coupled to memory blocks 112A and 114A. The memory block 112A may be coupled to the ECC block 162A using 128 data lines 272A and 272B and eight parity lines 274A and 274B. Similarly, the memory block 114A may be coupled to the ECC block 162A using 128 data lines 276A and 276B and eight parity lines 278A and 278B. In the illustrated diagram, the data lines 272A, 272B, 276A, and 276B are coupled to ECC memory blocks 284A and 284B. Similarly, the parity lines 274A, 274B, 278A, and 278B are coupled to ECC parity blocks 286A and 286B. The block diagram 270 details the ECC memory block 284A and the ECC parity block 286A, which interacts with the data line associated with the lowest data bit (e.g., data lines 272A and 276A), and the ECC parity block 286A, which interacts with parity line associated with the lowest parity bit (e.g., parity lines 274A and 278A). For clarity purposes, details of the ECC memory blocks 284B and ECC parity blocks 286B are omitted from the block diagram 270. ECC memory blocks 284B may include 127 instances of the circuitry illustrated in ECC memory block 284A and ECC parity blocks 286B may include 7 instances of the circuitry illustrated in ECC parity block 286B. The 128 bits of data from data lines 272A and 272B, and the eight parity bits from parity lines 274A and 274B may be provided by memory block 112A in parallel. Similarly, the 128 bits of data from data lines 276A and 276B, and the eight parity bits from parity lines 278A and 278B may be provided by memory block 114A in parallel.

The ECC block 162A may also include an ECC decoder 288, an ECC syndrome decoder 290, and bit correct blocks 292, which may facilitate ECC operations. The ECC decoder 288 may be used to generate parity bits (PoutP) 341 (which includes parity bit 340A) from 128 bits of data bits 321 (which include data bit 320A). The ECC syndrome decoder 290 may be used to produce an error information vector (SC) 315 (which includes error bit 314A) from the generated parity bits 341 and the retrieved parity bits (ECC_Bit) 339 (which includes parity bit 338A). For example, during a read operation, or during a masked-write operation, the ECC syndrome decoder 290 may determine the error information vector 315 using the generated parity bits 341 and the parity bits 339 stored along with the data bits 321. The error information vector 315 may have the same dimension as the number of bits of data (e.g., 128 bits in the example) and may indicate whether a particular bit of the data bits 321 is incorrect. The bit correct block 292 in the ECC memory block 284A may correct the corresponding data bit stored in latch 312 based on receiving the error bit 314A of the error information vector 315. In some embodiments, correction in the bit correct block 292 may take place using an inverter. As discussed above, the ECC memory blocks 284B may, each, have a respective bit correct block similar to bit correct block 292, which receives a corresponding error bit from the error information vector 315.

The ECC memory block 284A may also include a 3-input multiplexer 316 that may configure the ECC operations based on a control instruction (R/W/M_sel) 318. When the write mode W (e.g., input W) is selected, the multiplexer 316 may provide as data bit 320A the signal from the latch 322, which may be clocked by a triggering signal (MWRW_clk1) 313. The latch 322 may store a data bit 323 received from the RW bus 242. When the correct-bit mode M is selected, the multiplexer 316 may provide as data bit 320A the corrected data bit from the bit correct block 292. Correction of the bit is performed as described above. The correction of the data bit may be performed based on the triggering of latch 312 by triggering signal (MWRR_clk1) 311.

When the read mode R is selected in multiplexer 316, an output bit from the bank selection multiplexer 304 is provided as the data bit 320A. The bank selection multiplexer 304 may be configured by a bank selection command (BK_sel) 308. The bank selection multiplexer 304 may be used to receive a bit 306A from the data line 272A via a buffer 302A or bit 306B from the data line 276A via a buffer 302A. The output data bit 320A of the multiplexer 316 may be provided to the ECC decoder 288 during a read operation to identify errors, during a write operation to generate parity bits, and/or during a masked-write operation, to identify errors in the old data and to generate parity bits associated with the new data as discussed above. The output data bit 320A of the multiplexer 316 may also be provided to the latch 324, which is clocked by triggering signal (MWRW_clk2) 317. The output 397 of latch 324 may be coupled to latch 326A that provides data to memory block 112A via a buffer 302B. The output 397 of latch 324 may also be coupled to latch 326B that provides data to memory block 114A via a buffer 302B. Latches 326A and 326B may be controlled by triggering signal (CWCLK+BK_sel) 309, which may be gated by the bank selection command 308 to select which data bank receives the data generated by the ECC memory block 284A.

In some situations, such as during read and/or masked-write operations, the ECC parity block 286A may receive parity bits from the memory blocks 112A and 114A via buffers 332A. A bank selection multiplexer 334, which may be controlled by bank selection command 308, may be used to select which data should be used and stored in the latch 336. Latch 336 may be clocked by the triggering signal 311, which may also clock the latch 312, as described above. The parity bit 338A provided by the latch 336 may be provided to the ECC syndrome decoder 290 to identify errors in the read data, as described above. Parity bit 340A, generated by the ECC decoder 288 may be stored in a latch 346, which may be clocked by triggering signal (CWCLK) 309. A bank selection demultiplexer 342, controlled by the bank selection command 308 may determine whether the memory block 112A should receive the parity bit 344A via a buffer 332B or whether the memory block 114A should receive the parity bit 344B via a buffer 332B.

The ECC block 162A may also include circuitry that retrieves and stores a data mask 382 from the DM bus 244. To that end, a data mask latch 386, that may be clocked by triggering signal (MWRW_clk1) 313 that also triggers latch 322, may be used to store the data mask 382 and provide a latched data mask signal (LDM) 390 to indicate that a data mask 382 is ready for a masked-write operation. In some embodiments, the multiplexer 316 in the ECC memory block 284A may also be used to perform the data-masking step of a masked-write operation. As the multiplexer 316 may receive new data through its W input and the old data through its M input, data masking may be performed by adjusting the control instruction 318. For example, when masking should be performed, the multiplexer 316 may select the old data from the M input and when no masking should be performed, the multiplexer 316 may select the new data through its W input. To that end, the ECC logic may generate the control instruction 318 based on the received data mask 382, which may be latched in data mask latch 386.

Figure 4B:
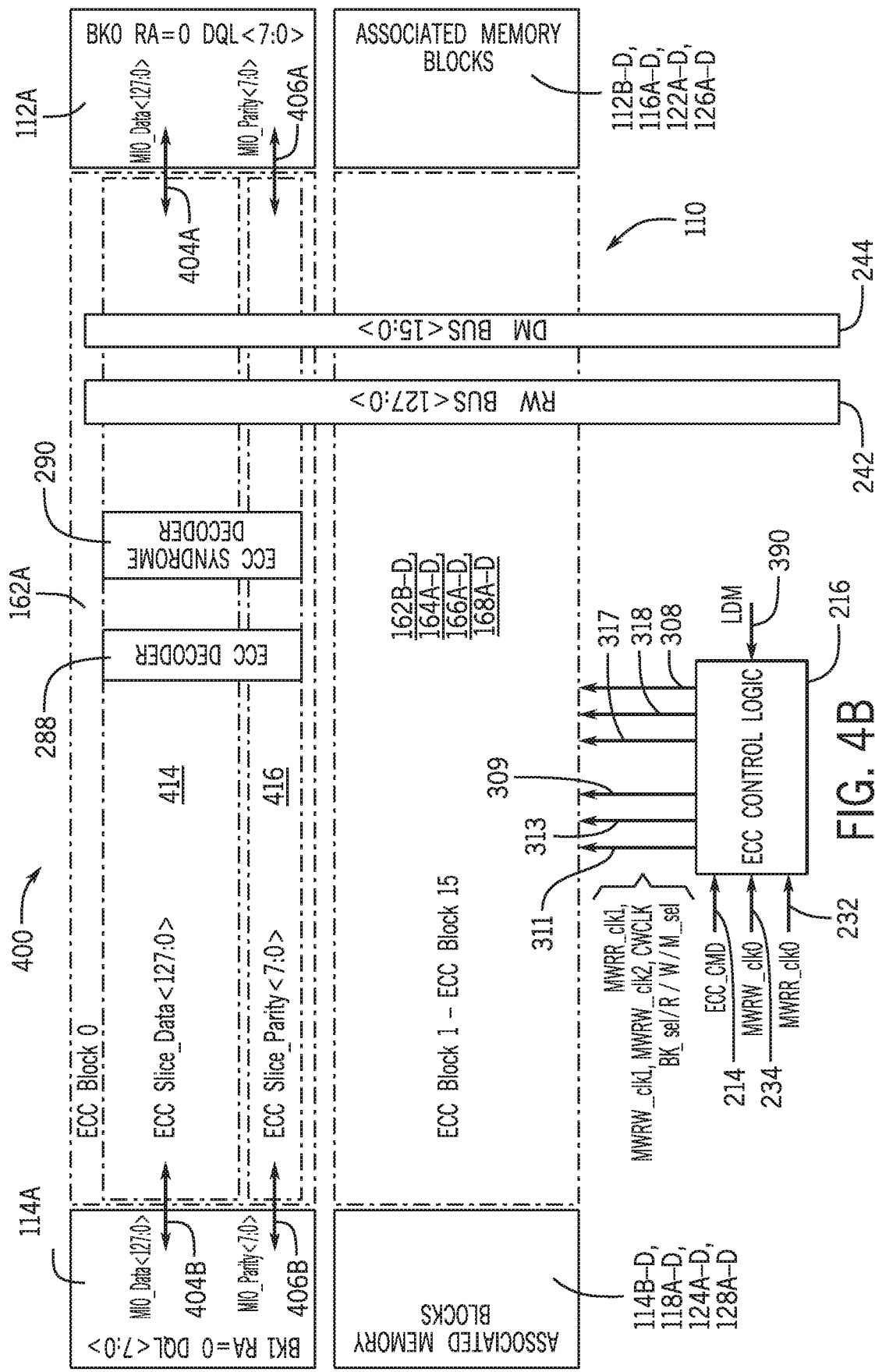
FIG. 4B is a schematic block diagram of a DRAM array having shared ECC blocks controlled by an ECC control logic, in accordance with embodiments of the present disclosure.

The FIG. 4B illustrates a schematic block diagram 400 that includes the DRAM array 110, along with the RW bus 242 and the DM bus 244, as illustrated in FIG. 4A. It should be noted that the data lines 272A and 272B in FIG. 4A are indicated in FIG. 4B as data lines 404A, data lines 276A and 276B are indicated as data lines 404B, parity lines 274A and 274B are indicated as parity lines 406A, and parity lines 278A and 278B are indicated as parity lines 406B. Moreover, ECC parity blocks 286A and 286B are referred herein as ECC parity blocks 416 and ECC memory blocks 284A and 284B are referred herein as ECC memory blocks 414. The block diagram 400 also illustrates the ECC control logic 216. The ECC control logic 216 may provide the block selection command 308, control instruction 318, and the triggering signals 309, 311, 313, and 317, which are indicated in FIG. 4A. The ECC control logic 216 may generate the signals based on the ECC command signal (ECC_CMD) 214, initiation signals (MWRW_clk0 and MWRR_clk0) 232 and 234, and the latched data mask signal (LDM) 390. In FIGS. 4A and 4B, the shared ECC blocks may serve two memory blocks of different data banks. It should be noted that the block selection command 308 may be used to select which memory block should be coupled to the shared ECC block in association with the ECC operation.

Figure 5:
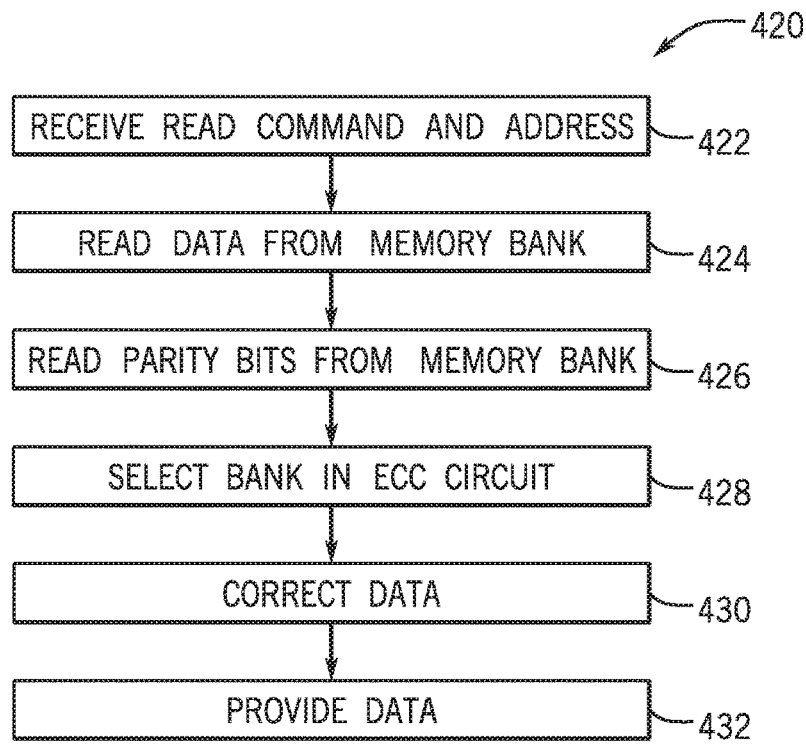
FIG. 5 is a flow chart for a method to perform memory read operations using shared ECC blocks, in accordance with embodiments of the present disclosure.
Figure 6:
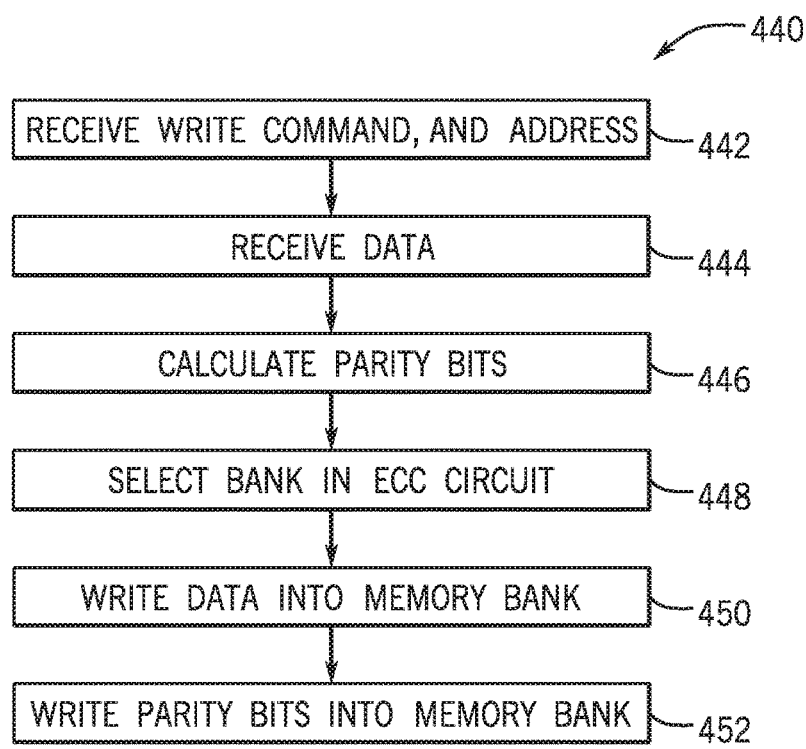
FIG. 6 is a flow chart for a method to perform memory write operations using shared ECC blocks, in accordance with embodiments of the present disclosure.
Figure 7:
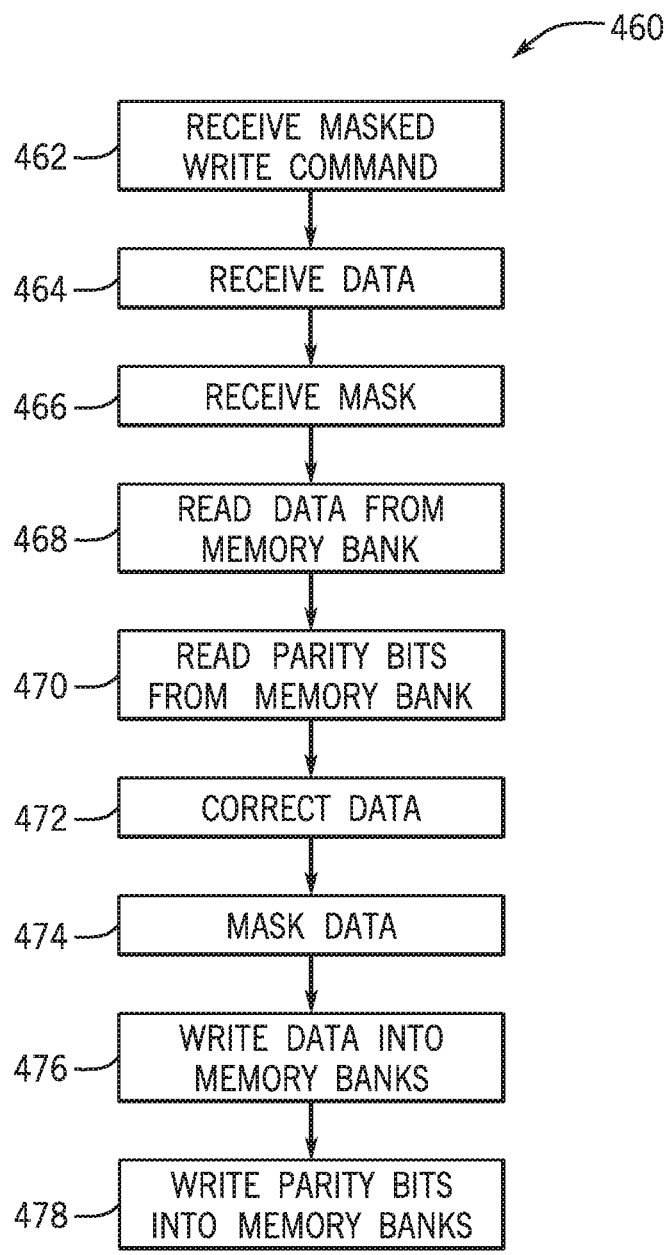
FIG. 7 is a flow chart for a method to perform masked-write operations using shared ECC blocks, in accordance with embodiments of the present disclosure.

With the foregoing in mind, FIGS. 5, 6, and 7 illustrate methods for memory devices to perform ECC operations during memory operations using shared ECC blocks, such as the ones illustrated above. FIG. 5 illustrates a method 420 to read data using the shared ECC block described above. The descriptions of certain processes include references to circuitry in FIGS. 4A and 4B as examples, for clarity. It should be noted that the method 420 might be employed with any memory device that may employ shared ECC circuitry, such as the ones described above. In a process block 422, the memory device may receive a command and address instruction containing a read operation command and an address. Based on the read operation, the memory device may access the appropriate memory cells by activating rows and columns of the memory blocks associated with the requested address.

In response to this activation, activated memory blocks (e.g., memory blocks 112A and/or 114A) may provide the read data to the shared ECC blocks (e.g., ECC block 162A) during in process block 424. This operation may be performed by using the data lines (e.g., data lines 404A, and/or 404B). The activated memory blocks may also provide the parity bits associated with the stored data to the corresponding shared ECC blocks, in process block 426. This operation may be performed by using the parity lines (e.g., parity lines 406A and/or 406B).

The memory device may also provide to the ECC blocks, commands to select which data bank is providing the data, in process block 428. This operation may be performed using, for example, the bank selection command 308. The verification and correction of data in the ECC block (e.g., ECC block 162A) may be performed in process block 430, based on a comparison between the retrieved parity bits and the calculated parity bits, as discussed above. Process blocks 424, 426, and 428 may be performed in parallel, or in any other order, and the scheduling of the processes may be adjusted using the triggering signals, as discussed above. Process block 430 may take place after process blocks 426 and 428.

When the two banks coupled to an ECC block have data being requested (e.g., both memory blocks 112A and 114A provide data to the ECC block 162A), the bank selection command 308 in process block 428 may be used in conjunction with the triggering signals and the latches to serve both data sequentially. For example, process blocks 424, 426, and 428 may be performed to serve memory block 112A and, sequentially, process blocks 424, 426, and 428 may be performed to serve memory block 114A while process block 430 is performed to serve memory block 112A. This type of pipelining may be used to reduce the latency of memory operations during active sharing of the ECC block. At the end of process block 430, the read data is ready to be provided to the I/O interface (e.g., via the RW bus 242), which may return the data to the requesting processing circuit, in process block 432.

FIG. 6 illustrates a method 440 to write data using the shared ECC block described above. The description of some processes may refer to elements of FIGS. 4A and 4B as examples. It should be noted that the method 440 might be employed with any memory device that may employ shared ECC circuitry. In a process block 442, the memory device may receive a command and address instruction containing a write operation command and an address. In a process block 444, I/O circuitry (e.g., I/O circuit 246) of the memory device may receive the incoming data, which may be passed to the data banks via, for example, the RW bus 242. The data banks that receive the data may be determined based on the requested address. The ECC block associated with the data banks and/or blocks may receive the write data. For example, ECC block 162A may receive data directed to the memory blocks 112A and/or 114A.

As discussed above, the ECC block may be used to calculate parity bits, in process block 446. For example, the ECC block 162A may calculate the parity bits 341 from the incoming data (e.g., data bit 323). After calculating the parity bits, the received data may be directed to the appropriate memory block, along with the calculated parity bits, in process block 448. The selection of the memory block may be performed using a bank selection command, such as bank selection command 308. For example, the ECC block 162A may use latches 326A or 326B along with the bank selection command 308 to direct the received data, and may use latch 346 with bank selection demultiplexer 342 along with the bank selection command 308 to direct the calculated parity bits. Transfer of the received data, in process block 450, may be performed using the data lines (e.g., data lines 404A and/or 404B), and transfer of parity bits, in process block 452, may be performed by using the parity lines (e.g., parity lines 406A and/or 406B).

Process blocks 448, 450, and 452 may be performed in parallel, or in any other order, and the scheduling of the processes may be adjusted using the triggering signals, as discussed above. When the two banks coupled to an ECC block have addresses for writing data (e.g., both memory blocks 112A and 114A are to receive data from the ECC block 162A), the bank selection command 308 in process block 448 may be used in conjunction with the triggering signals and the latches in process blocks 444, 446, 448, 450, and 452 to serve both memory blocks sequentially. For example, process blocks 444, 446, and 448 may be performed to serve memory block 112A and, sequentially, process blocks 444, 446, and 448 may be performed to serve memory block 114A while process block 450 and 452 is performed to serve memory block 112A. This type of pipelining may be used to reduce the latency of memory operations during active sharing of the ECC block. At the end of process block 450 and/or 452, the data may be stored in the data banks.

FIG. 7 illustrates a method 460 to perform masked-write operations using the shared ECC block above described. The description of some processes refers to FIGS. 4A and 4B. It should be noted that the method 460 might be employed with any memory device that may employ shared ECC circuitry. In a process block 462, the memory device may receive a command and address instruction containing a masked-write operation command and an address. In a process block 464, I/O circuitry (e.g., I/O circuit 246) of the memory device may receive the incoming data, which may be passed to the data banks via, for example, the RW bus 242. In the process block 466, the I/O circuitry (e.g., I/O circuit 246) of the memory device may receive the data mask 382 via, for example, the DM bus 244.

The masked-write data operation may also cause the memory device to access the appropriate memory cells by activating rows and columns of the memory blocks associated with the requested address. In response to this activation, the activated memory blocks (e.g., memory blocks 112A and/or 114A) may provide the stored data to the shared ECC blocks (e.g., ECC block 162A) in process block 468. This operation may be performed by using the data lines (e.g., data lines 404A, and/or 404B in FIG. 4A). The activated memory blocks may also provide the parity bits associated with the stored data to the corresponding shared ECC blocks, in process block 470. This operation may be performed by using the parity lines (e.g., parity lines 406A and/or 406B). The memory device may also provide commands to select the data bank (e.g., bank selection command 308) to the ECC block. The verification and correction of read data in the ECC block (e.g., ECC block 162A) may be performed in process block 472, based on a comparison between the retrieved parity bits and calculated parity bits, as discussed above.

In a process block 474, the new masked data may be generated. This process may be performed based on the corrected data, generated in process block 472, the received data, received in process block 464, and the received data mask 382, received in process block 466. The new masked data may be performed by selectively changing bytes of the corrected data by bytes in the received data using the received data mask 382 as a guide. The new masked data that is generated may then be stored in the data bank. As discussed above, the ECC block may be used to calculate parity bits associated with the new masked data. For example, the ECC block 162A may calculate the parity bits 341 from the received data (e.g., data bits 321).

After calculating the parity bits, the received data may be directed to the appropriate memory block, along with the calculated parity bits. Transfer of the new masked data, in process block 476, may be performed using the data lines (e.g., data lines 404A and/or 404B in FIG. 4A), and transfer of parity bits, in process block 478, may be performed by using the parity lines (e.g., parity lines 406A and/or 406B). The process blocks of method 460, may be performed in parallel, or in any other order, and the scheduling of the processes may be adjusted using the triggering signals, as discussed above. At the end of process block 476 and/or 478, the masked data may be stored in the data banks.

Figure 8:
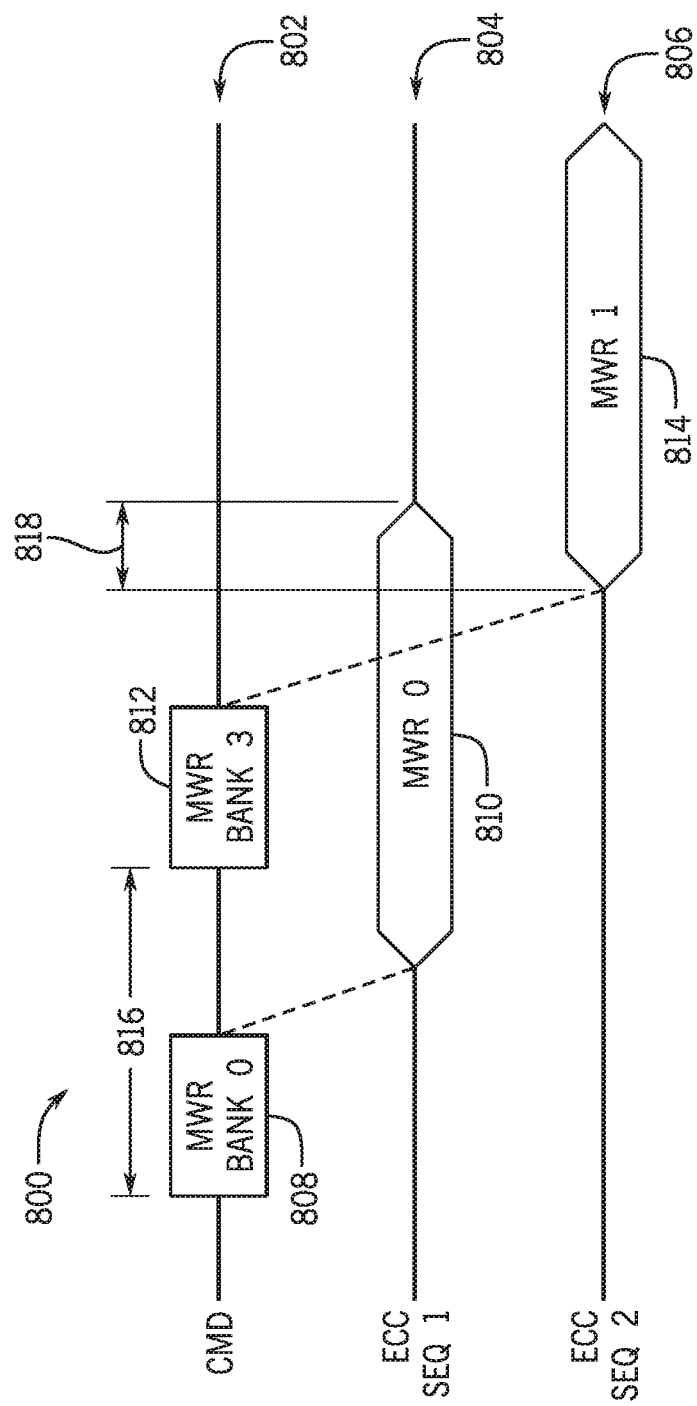
FIG. 8 is a timing diagram illustrating adjacent masked-write operations, in accordance with embodiments of the present disclosure.

When two banks that share an ECC block are involved in masked-write operations (e.g., both memory blocks 112A and 114A are performing masked-write operations using the shared ECC block 162A), pipelining may be used to facilitate the sharing. An example of such is illustrated in the timing diagram 800 in FIG. 8. The timing diagram 800 may include a command chart 802, the ECC sequence chart 804 associated with a first masked-write command and the ECC sequence chart 806 associated with a second masked-write command. The command chart 802 includes a first masked-write command 808, which may lead to the series of masked-write ECC operations 810. The command chart 802 includes a second masked-write command 812, which may lead to the series of masked-write ECC operations 814.

Masked-write commands 808 and 812 may be associated with different data banks (e.g., the addresses are associated with different data banks), and may be separated by the latency 816. As discussed above, the minimum latency for operations that take place in different data banks may be relatively small, when compared with the latency for operations that take place in a common data bank. This may be related to the time for performance of the masked-write ECC operations 810 and 814. As a result, an overlapping period 818 may occur. If the masked-write ECC operations 810 and 814 are performed using different ECC blocks, the overlapping period 818 does not necessarily interfere with operations. However, if a shared ECC block serves two different data banks (e.g., data banks 0 and 1 in this example) the overlapping period 818 may lead to congestion in the shared ECC block. To prevent such congestion, pipelining strategies, such as the one detailed below in FIGS. 9-16, may be used.

Figure 9:
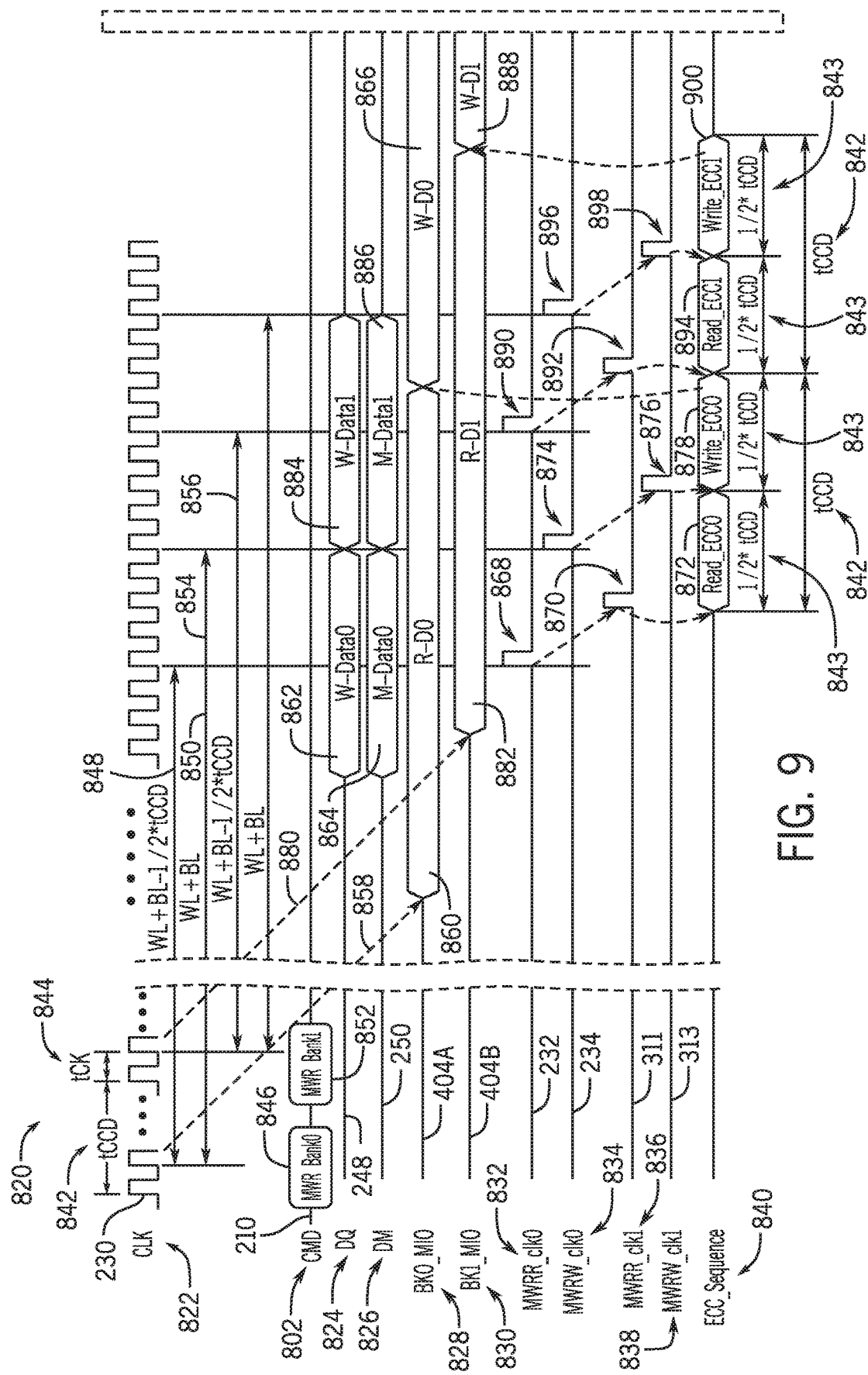
FIG. 9 is a timing diagram illustrating triggering signals and data signals that may be exchanged during adjacent masked-write operations, in accordance with embodiments of the present disclosure.

With the foregoing in mind, the timing diagram 820 of FIG. 9 illustrates triggering signals and data flows associated with the above described pipelining. The timing diagram 820 includes the command chart 802, a clock chart 822, a data chart 824, a data mask chart 826, an ECC I/O chart 828 associated with a first data bank, an ECC I/O chart 830 associated with a second data bank, initiation signal charts 832 and 834, ECC signal charts 836, and 838, and the ECC sequence chart 840. The following descriptions make reference to a tCCD period 842 (i.e., the column-to-column period, which may be the minimum latency period between two masked-write commands to different banks) and the tCK period 844, which may be the period of the clock signal. The timing diagram 820 also includes references to the write latency, represented by WL, and the burst length, represented by BL.

In the timing diagram 820, the command and address signal 210 may include a first masked-write command 846, which may be directed to a data bank 0, as illustrated in the command chart 802. Following the write latency associated with the first masked-write command, the processor may provide the new data 862 and the data mask 864 associated with the first masked-write command 846, as represented in the data chart 824 and the data mask chart 826. Following a tCCD period 842 after the first masked-write command 846, the command and address signal 210 may receive a second masked-write command 852, which may be directed to a data bank 1. Following the write latency associated with the second masked-write command, which is equivalent to a period 850 (WL+BL), the processor may provide the new data 884 and the data mask 886 associated with the second masked-write command 852, as represented in the data chart 824 and the data mask chart 826.

As clocked by the first masked-write command 846 (dashed arrow 858), the data bank 0 may provide the old data from the requested address, as well as the corresponding parity bits, to the ECC block (operation 860) via data lines 404A and parity lines 406A. A write latency counter 224, as illustrated in FIG. 3, may provide an initiation pulse 868 using initiation signal 232. As illustrated, the initiation pulse 868 may be provided in the (WL+BL−½*tCCD) period 848 from the issue of the first masked-write command 846. ½*tCCD corresponds to 4*tCK (or 4 cycles of the clock signal CLK). In response, the ECC control logic 216 may provide a pulse 870 via triggering signal 311, which may initiate the ECC operations 872 related to the old data (e.g., verify and correct the old data). Pulse 870 may trigger, for example, latches 312 and 336 illustrated in FIG. 4A.

Following half of the tCCD period 842, the write latency counter 224 may provide an initiation pulse 874 using initiation signal 234. That is, the initiation pulse 874 may be provided in the (WL+BL) period 850 from the issue of the first masked-write command 846. In response, the ECC control logic 216 may provide a pulse 876 via triggering signal 313, that may initiate the ECC operation 878 related to the masked data (e.g., generate parity bits for the new masked data). Pulse 876 may trigger, for example, latches 322 and 386 illustrated in FIG. 4A. ECC operations 872 and 878 may, each, take up to a half tCCD period 843, resulting in a total time of one tCCD period 842. Following the ECC operation 878, the data may be provided back to the data bank 0 using the data lines 404A during operation 866, represented in the ECC I/O chart 828.

As clocked by the second masked-write command 852 (dashed arrow 880), the data bank 1 may provide the old data from the requested address, as well as the corresponding parity bits, to the ECC block (operation 882) via data lines 404B and parity lines 406B. It should be noted that operations 860 and 882 may have some timing overlap. The ECC block may prevent data collision using bank selection multiplexers 304 and 334, controlled by bank selection command 308. The write latency counter 224, as illustrated in FIG. 3, may provide an initiation pulse 890 using initiation signal 232. As illustrated, the initiation pulse 890 may be provided in the (WL+BL−½*tCCD) period 854 from the issue of the second masked-write command 852. In response, the ECC control logic 216 may provide a pulse 892 via triggering signal 311, which may initiate the ECC operations 894 related to the old data (e.g., verify and correct the old data). Pulse 892 may trigger, for example, latches 312 and 336 illustrated in FIG. 4A.

Following half of the tCCD period 842, the write latency counter 224 may provide an initiation pulse 896 using initiation signal 234. That is, the initiation pulse 896 may be provided in the (WL+BL) period 856 from the issue of the second masked-write command 852. In response, the ECC control logic 216 may provide a pulse 898 via triggering signal 313, that may initiate the ECC operation 900 related to the masked data (e.g., generate parity bits for the new masked data). Pulse 898 may trigger, for example, latches 322 and 386 illustrated in FIG. 4A. ECC operations 894 and 900 may, each, take up to a half tCCD period 843, resulting in a total time of one tCCD period 842. Following the ECC operation 900, the data may be provided back to the data bank 1 using the data lines 404B during operation 888, represented in the ECC I/O chart 830. It should be noted that operations 866 and 888 might have some timing overlap. The ECC block may prevent misdirection of the masked data by using the bank selection command 308 in conjunction with latches 326A and 326B, and the bank selection demultiplexer 342.

Figure 10:
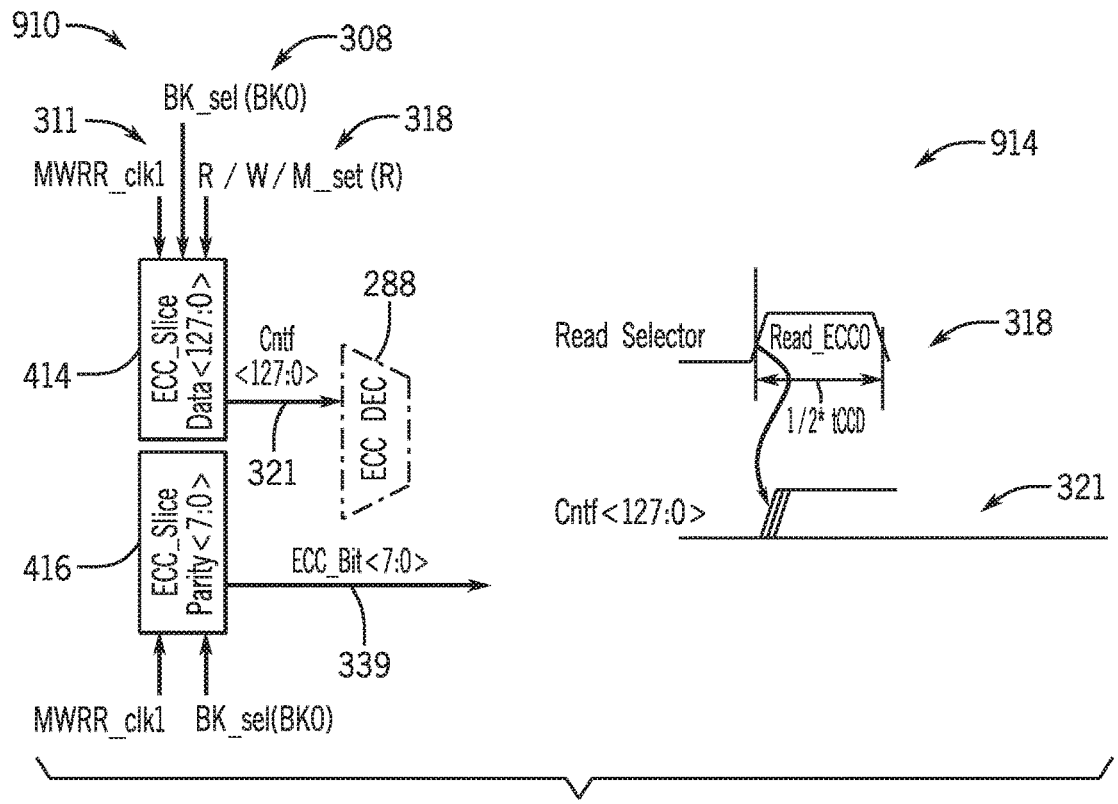
FIG. 10 includes a first data flow and timing diagrams illustrating masked-write operation performance, in accordance with embodiments of the present disclosure.

The data operations for the ECC block in response to the above commands during a sequence of masked-write operations are detailed in FIGS. 10, 11, 12, 13, 14, 15, and 16, which include the schematic data flow and timing charts. FIG. 10 includes a schematic data flow diagram 910 and timing diagram 914. As illustrated, the triggering signal 311, generated in response to the initiation signal 232, may cause the ECC memory blocks 414 and the ECC parity blocks 416 to latch the old data and the parity bits, respectively. The old data and the parity bits are associated with the bank 0, and the latching may be performed employing the latch 312 and 336, bank selection multiplexers 304 and 334, as controlled by bank selection command 308. Moreover, the multiplexer 316, which coordinates the data transferred to the ECC decoder 288, may be adjusted by setting the control instruction 318 to the read mode R (e.g., input R), which provides the data from data lines 404A as data bits 321 to the ECC decoder 288.

Figure 11:
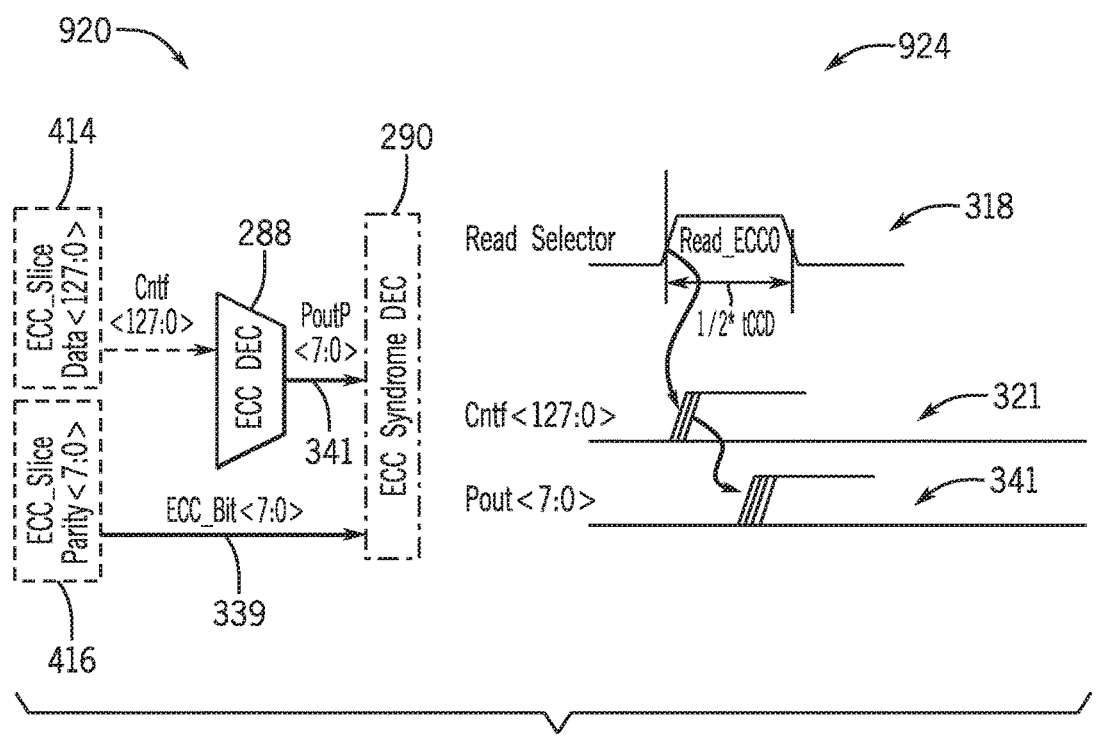
FIG. 11 includes a second data flow and timing diagrams illustrating masked-write operation performance, and may follow the diagrams of FIG. 10.
Figure 12:
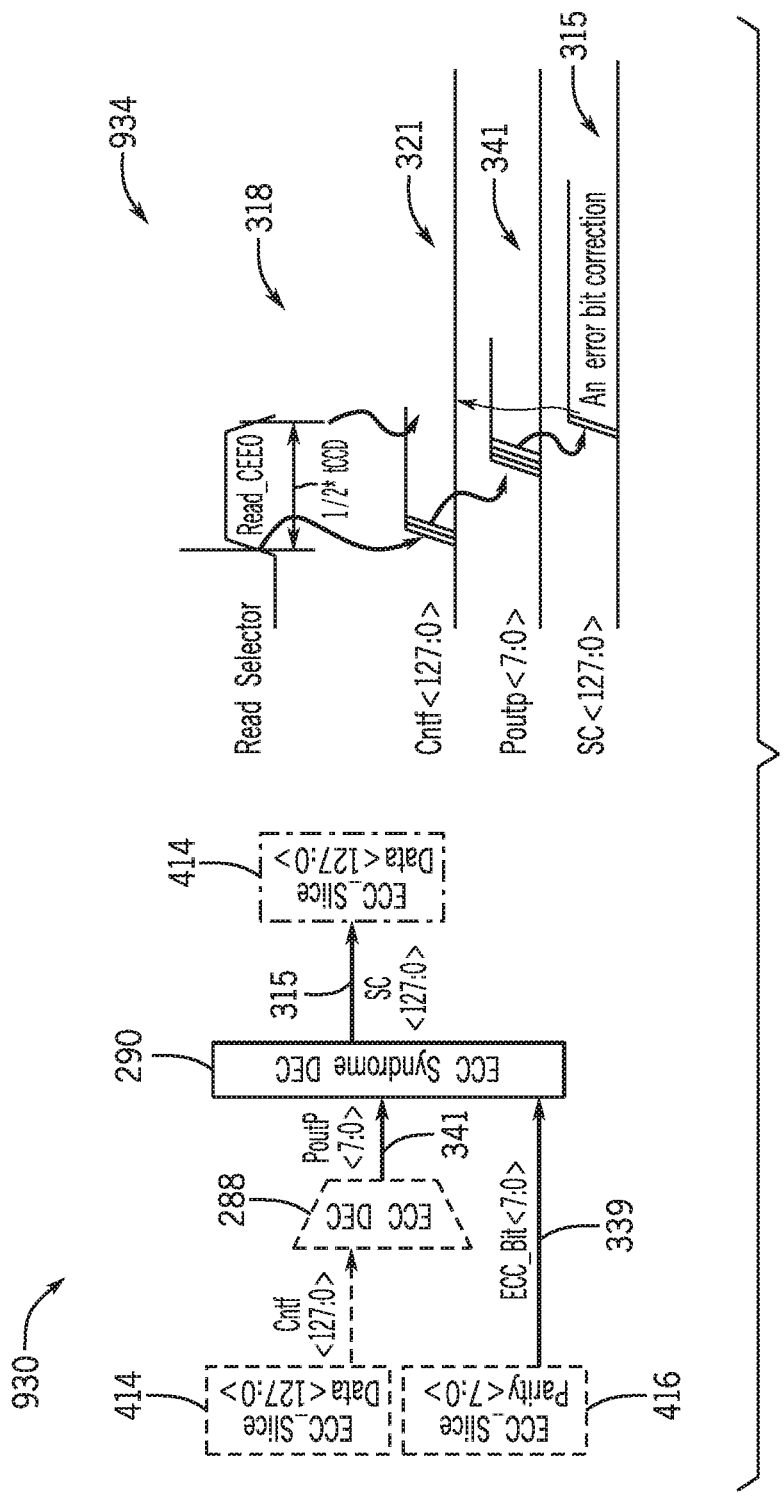
FIG. 12 includes a third data flow and timing diagrams illustrating masked-write operation performance, and may follow the diagrams of FIG. 11.

FIG. 11 includes a schematic data flow diagram 920 and timing diagram 924. As illustrated, the ECC decoder 288 may generate parity bits 341. The ECC syndrome decoder 290 may receive the generated parity bits 341 and the retrieved parity bits 339. FIG. 12 includes a schematic data flow diagram 930 and timing diagram 934. As illustrated, the ECC syndrome decoder 290 may generate an error information vector 315. The error information vector 315 may indicate if a bit has an error, and may be used to cause bit correct blocks 292 of the ECC memory blocks 414 to generate a corrected old data. The multiplexer 316 may receive the corrected old data from the bit correct blocks 292 by setting the control instruction 318 to the correct-bit mode M (e.g., input M).

Figure 13:
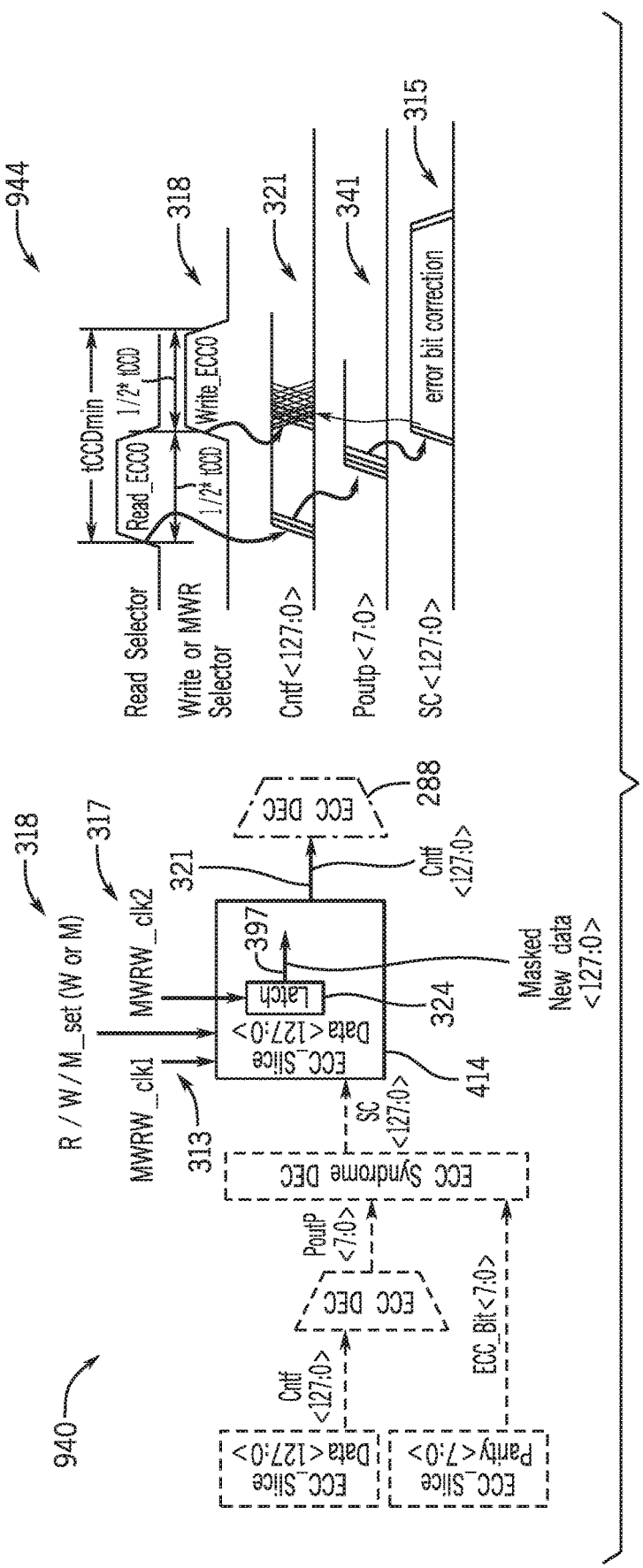
FIG. 13 includes a fourth data flow and timing diagrams illustrating masked-write operation performance, and may follow the diagrams of FIG. 12.

FIG. 13 includes a schematic data flow diagram 940 and timing diagram 944. As illustrated, a triggering signal 313, generated in response to the initiation signal 234, may cause latch 322 to latch the incoming data (e.g., data bit 323) and the data mask latch 386 to latch data mask 382. The incoming data may be selected by the multiplexer 316 by setting the control instruction 318 to the write mode W. In some embodiments, the control instruction 318 may be adjusted based on the data mask 382. For example, when a mask bit of the data mask 382 designates "no-mask" (i.e., the incoming data should replace the corrected old data), the multiplexer 316 may be adjusted by setting the control instruction 318 to the write mode W. When a mask bit of the data mask 382 designates "mask" (i.e., the corrected old data should be preserved), the multiplexer 316 may be adjusted by setting the control instruction 318 to the correct-bit mode M. As a result, ECC memory block 414 provides as data bits 321 to the ECC decoder 288 the new masked data. The new masked data may also be stored by latch 324 in response to the triggering signal 317. The output 397 of latch 324 may be provided to the data banks for storage.

Figure 14:
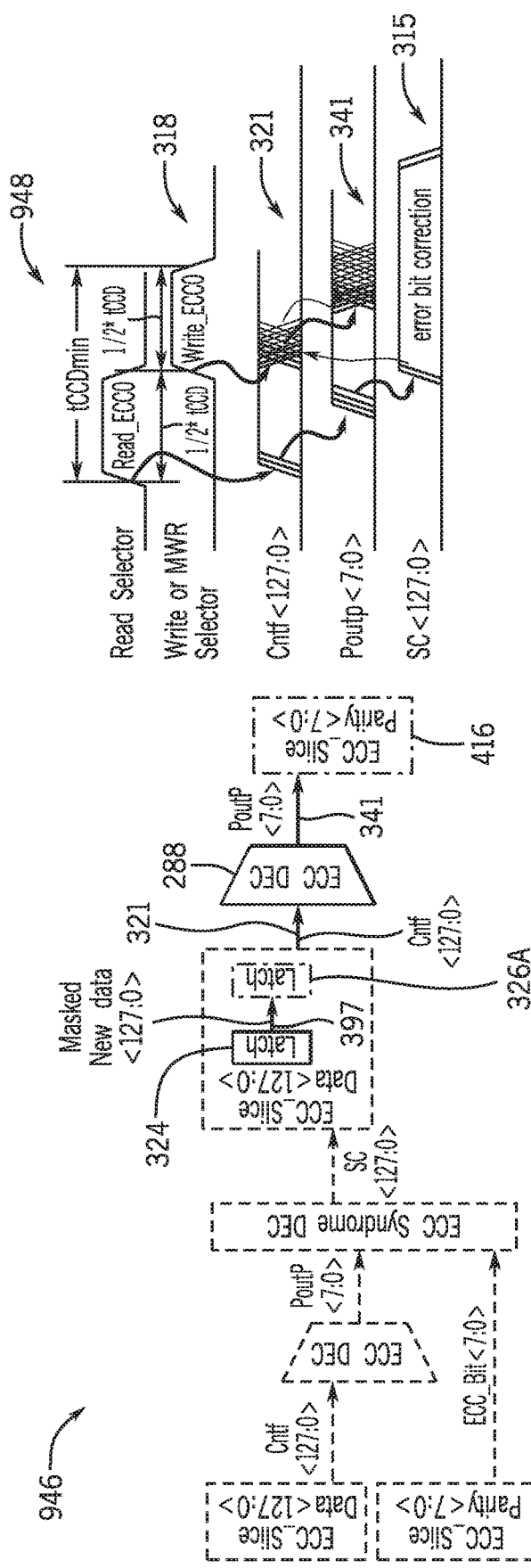
FIG. 14 includes a fifth data flow and timing diagrams illustrating masked-write operation performance that may follow the diagrams of FIG. 13.
Figure 15:
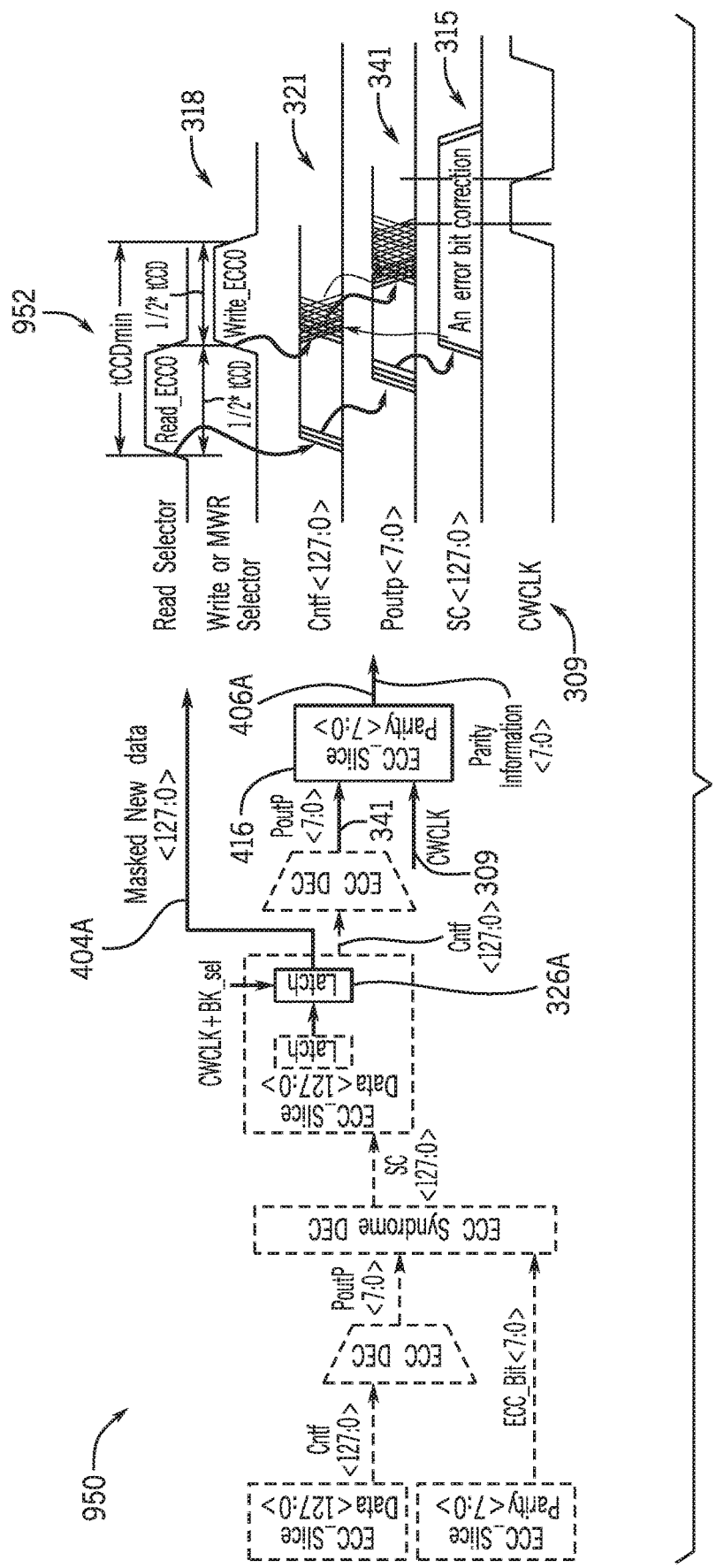
FIG. 15 includes a sixth data flow and timing diagrams illustrating masked-write operation performance, and may follow the diagrams of FIG. 14.
Figure 16:
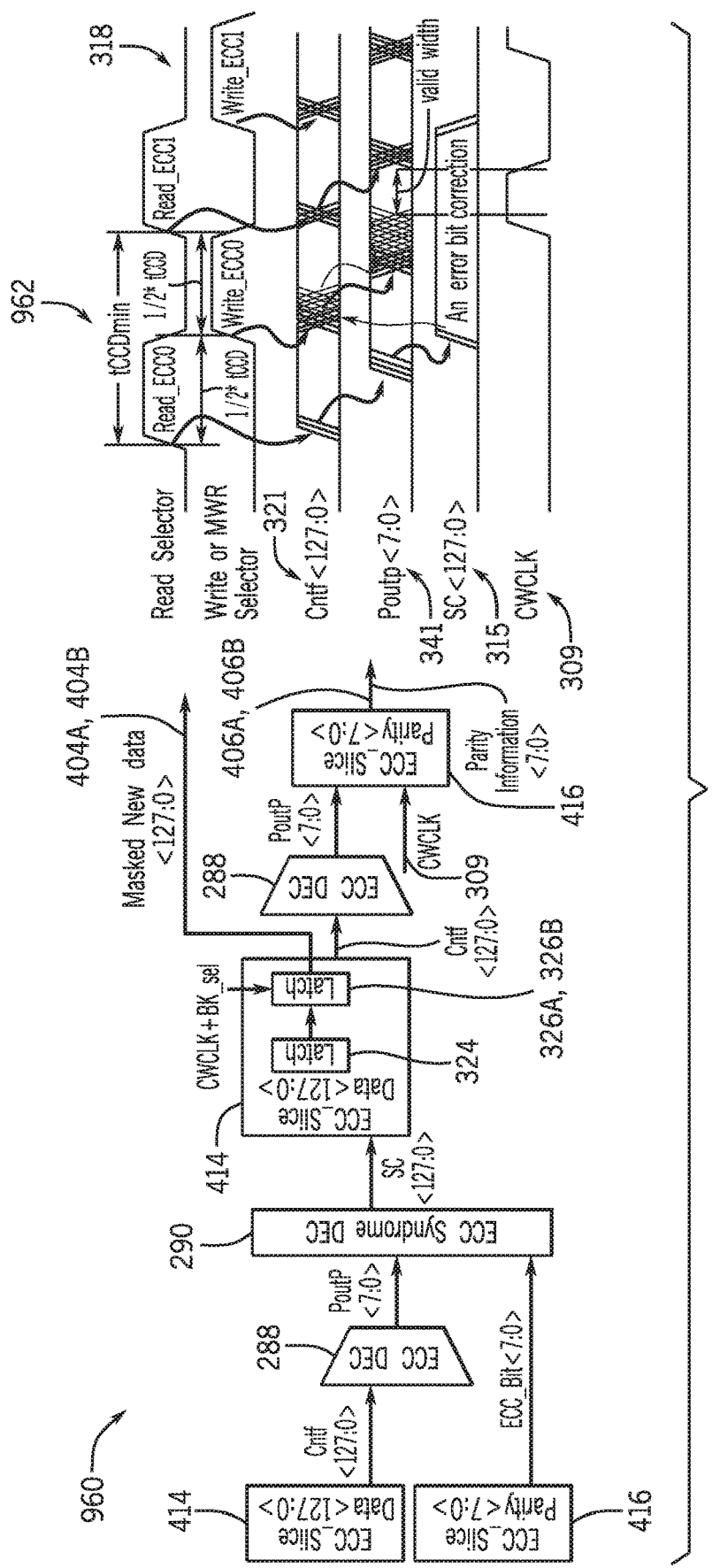
FIG. 16 includes a seventh data flow and timing diagrams illustrating masked-write operation performance, and may follow the diagrams of FIG. 15.

FIG. 14 includes a data flow diagram 946 and a timing diagram 948. In this diagram, the ECC decoder 288 generates the parity bits 341 from the new masked data provided via data bits 321. The parity bits may be provided to the ECC parity blocks 416. FIG. 15 includes a data flow diagram 950 and a timing diagram 952. In this diagram, triggering signal 309 may be asserted to trigger the latch 326A to store the output 397 of latch 324 containing the new masked data. The new masked data and its parity information are transferred to the data bank 0 using data lines 404A and parity lines 406A. FIG. 16 illustrates a data flow diagram 960 and a timing diagram 962. In this diagram, the bank selection command 308 may be adjusted to configure the process to operate with data bank 1. The processes described above in FIGS. 10-16 for data bank 0 may be performed with data bank 1.

While the embodiments set forth in the present disclosure may be susceptible to various modifications and alternative forms, specific embodiments have been shown by way of example in the drawings and have been described in detail herein. However, it may be understood that the disclosure is not intended to be limited to the particular forms disclosed. The disclosure is to cover all modifications, equivalents, and alternatives falling within the spirit and scope of the disclosure as defined by the following appended claims.

What is claimed is:

1. An apparatus comprising:
   a first memory block of a first data bank, the first memory block comprising a first plurality of memory cells;
   a second memory block of a second data bank, the second memory block comprising a second plurality of memory cells, wherein the second memory block is adjacent to the first memory block, and wherein the second data bank is distinct from the first data bank; and
   an error check and correct (ECC) block arranged between the first memory block and the second memory block and configured to perform ECC operations associated with memory operations of the first memory block and the second memory block, wherein the ECC block comprises:
      a bit correct block configured to receive read data from the first memory block or the second memory block; and
      a multiplexer comprising a first input, a second input, and a third input, wherein the first input is configured to receive the read data from one of the first memory block and the second memory block, the second input is configured to receive write data from a read/write bus, and the third input is configured to receive corrected data from the bit correct block.

2. The apparatus of claim 1, wherein the ECC block comprises input circuitry and output circuitry, a first block selection circuitry configured to couple the input circuitry to the first memory block or to the second memory block based on a bank selection command, and a second block selection circuitry configured to couple the output circuitry to the first memory block or to the second memory block based on the bank selection command.

3. The apparatus of claim 2, wherein the first block selection circuitry comprises a multiplexer controlled by the bank selection command.

4. The apparatus of claim 2, wherein the second block selection circuitry comprises a first latch coupled to the first memory block and a second latch coupled to the second memory block, wherein the first latch and the second latch are controlled by the bank selection command.

5. The apparatus of claim 1, comprising an input/output circuit coupled to the read/write bus, wherein the input/output circuit is configured to receive data from and provide data to outside of the apparatus.

6. The apparatus of claim 1, wherein the multiplexer is configured to perform a masked-write operation by:
receiving a data mask signal;
selecting the write data from the second input when the data mask signal indicates masking; and
selecting the corrected data from the third input when the data mask signal indicates no masking.

7. The apparatus of claim 1, wherein the memory operations comprise a read operation, a write operation, or a masked-write operation.

8. The apparatus of claim 1, comprising a dynamic random access memory (DRAM) device.

9. A memory device, comprising:
control circuitry comprising a command decoder, an address decoder, and a write latency counter, wherein the write latency counter is configured to receive a signal from the command decoder and to provide an initiation signal; and
a dynamic random access memory (DRAM) array comprising:
a plurality of data banks, wherein each data bank comprises a set of memory blocks;
a plurality of error check and correct (ECC) blocks, wherein each respective ECC block comprises a respective ECC decoder and a respective ECC syndrome decoder arranged between a first respective memory block of a first respective data bank and a second respective memory block of a second respective data bank distinct from the first respective data bank, wherein the first respective memory block is adjacent to the second respective memory block, and wherein each respective ECC block is configured to couple to the first respective memory block and the second respective memory block; and
an ECC control logic configured to receive the initiation signal and to provide at least one triggering signal and a bank selection command to at least one ECC block of the plurality of ECC blocks, wherein the at least one ECC block is configured to perform ECC operations on one of the first respective memory block and the second respective memory block based on the at least one triggering signal and the bank selection command.

10. The memory device of claim 9, wherein the command decoder is configured to receive a read command, a write command, and a masked-write command.

11. The memory device of claim 9, comprising an I/O circuit, a read/write bus configured to transfer data between the I/O circuit and the at least one ECC block of the plurality of ECC blocks, and a data mask bus configured to provide a data mask to the at least one ECC block of the plurality of ECC blocks.

12. The memory device of claim 11, wherein each respective ECC block comprises a respective 3-input multiplexer configured to receive read data from the first respective memory block or the second respective memory block via a first input, to receive write data from the read/write bus via a second input, and receive corrected data from respective bit correct blocks via a third input of the respective ECC block.

13. The memory device of claim 12, wherein each respective ECC syndrome decoder is configured to provide an error information vector to the respective bit correct blocks.

14. The memory device of claim 12, wherein each respective 3-input multiplexer is configured to perform data masking by selecting the write data via the second input when the data mask indicates no masking, and selecting the corrected data via the third input when the data mask indicates masking.

15. The memory device of claim 9, wherein the memory device comprises a double data rate (DDR) memory device, a graphics DDR (GDDR) memory device, or a low-power DDR (LPDDR) memory device.

16. A method to perform a masked-write operation using a shared error-check and correct (ECC) block coupled to and arranged between a first memory block and a second memory block of different memory banks of a memory device, the method comprising:
retrieving first read data from the first memory block using a first bank selection circuit of the ECC block;
correcting the first read data using an ECC decoder, an ECC syndrome decoder, and bit correct circuitry of the ECC block to generate first corrected data;
receiving first write data from a read/write (RW) bus coupled to the ECC block;
receiving first data mask from a data mask (DM) bus coupled to the ECC block;
generating first masked-write data based on the first corrected data, the first write data and the first data mask; and
providing the first masked-write data to the first memory block using a second bank selection circuit of the ECC block; and
wherein the memory device comprises a column-to-column (tCCD) period and the generation of the first masked-write data is performed in one tCCD period.

17. The method of claim 16, comprising:
retrieving second read data from the second memory block using the first bank selection circuit;
correcting the second read data using the ECC decoder, the ECC syndrome decoder, and the bit correct circuitry of the ECC block to generate second corrected data;
receiving second write data from the RW bus;
receiving second data mask from the DM bus;
generating second masked-write data based on the second corrected data, the second write data and the second data mask; and
providing the second masked-write data to the second memory block using the second bank selection circuit.

18. The method of claim 16, wherein generating the first masked-write data comprises selecting the first write data when the first data mask indicates no masking and selecting the first corrected data when the first data mask indicates masking.

19. The method of claim 16, wherein correcting the first read data comprises generating parity bits using the ECC decoder, determining an error information vector using the ECC syndrome decoder, and selectively inverting bits using the bit correct circuitry based on the error information vector.

20. A memory device comprising:
   a first memory block belonging to a first memory bank, the first memory block comprising a first plurality of memory cells;
   a second memory block belonging to a second memory bank, the second memory block comprising a second plurality of memory cells, wherein the second memory bank is distinct from the first memory bank, and wherein the first memory block of the first memory bank is adjacent to the second memory block of the second memory bank; and
   an error check and correct (ECC) block comprising:
      an ECC circuit disposed between the first and second memory blocks, the first and second memory blocks share the ECC circuit, wherein the ECC circuit performs ECC operations on the first and the second memory block, and the ECC circuit comprises an error corrector configured to receive the output from either the first memory block or the second memory block; and
      a multiplexer having a first input, a second input, and a third input, wherein the first input is configured to receive an output from either the first memory block or the second memory block, the second input is configured to receive a data signal from a read/write (RW) bus, and the third input is configured to receive an output of the error corrector.

21. The memory device of claim 20, wherein the ECC circuit comprises an input node and an output node and wherein the ECC block comprises:
   a first control circuitry configured to selectively couple the input node of the ECC circuit to the first memory block or to the second memory block; and
   a second control circuit configured to selectively couple the output node of the ECC circuit to the first memory block or to the second memory block.

22. The memory device of claim 20, comprising a data input/output circuit coupled to the RW bus, the data input/output circuit configured to receive and provide data from and to outside of the memory device.

* * * * *

UNITED STATES PATENT AND TRADEMARK OFFICE
CERTIFICATE OF CORRECTION

PATENT NO. : 10,957,413 B2  
APPLICATION NO. : 16/176952  
DATED : March 23, 2021  
INVENTOR(S) : Susumu Takahashi et al.

Page 1 of 1

It is certified that error appears in the above-identified patent and that said Letters Patent is hereby corrected as shown below:

In the Drawings

In Fig. 1C, Sheet 3 of 19, delete "  " and insert -- -- , therefor.

Signed and Sealed this  
First Day of June, 2021

Drew Hirshfeld  
*Performing the Functions and Duties of the*  
*Under Secretary of Commerce for Intellectual Property and*  
*Director of the United States Patent and Trademark Office*